United States Patent [19]

Kuroyanagi et al.

[11] Patent Number: 5,798,550
[45] Date of Patent: Aug. 25, 1998

[54] VERTICAL TYPE SEMICONDUCTOR DEVICE AND GATE STRUCTURE

[75] Inventors: Akira Kuroyanagi, Okazaki; Masami Yamaoka, Anjo; Yoshifumi Okabe, Anjo; Yasuaki Tsuzuki, Anjo; Yutaka Tomatsu, Okazaki, all of Japan

[73] Assignee: Nippondenso Co. Ltd., Kariya, Japan

[21] Appl. No.: 469,622

[22] Filed: Jun. 6, 1995

Related U.S. Application Data

[63] Continuation of Ser. No. 38,096, Mar. 30, 1993, abandoned, which is a continuation-in-part of Ser. No. 767,313, Sep. 30, 1991, Pat. No. 5,250,449.

[30] Foreign Application Priority Data

| Oct. 1, 1990 | [JP] | Japan | 2-264701 |
| Mar. 30, 1992 | [JP] | Japan | 4-073696 |
| Mar. 30, 1992 | [JP] | Japan | 4-074493 |

[51] Int. Cl.[6] .......................... H01L 29/76; H01L 29/94; H01L 31/062
[52] U.S. Cl. .......................... 257/341; 257/342; 257/346
[58] Field of Search ................ 257/139, 138, 257/900, 140, 141, 341, 335, 336, 337, 329, 408, 410, 411

[56] References Cited

U.S. PATENT DOCUMENTS

| 4,638,347 | 1/1987 | Iyer | 257/900 |
| 4,672,407 | 6/1987 | Nakagawa et al. | 257/139 |
| 4,879,254 | 11/1989 | Tsuzuki et al. | 437/41 |
| 4,896,199 | 1/1990 | Tsuzuki et al. | 257/139 |
| 4,904,613 | 2/1990 | Coe et al. | 257/139 |
| 4,998,151 | 3/1991 | Korman et al. | 257/139 |
| 5,008,720 | 4/1991 | Uenishi | 257/341 |
| 5,031,009 | 7/1991 | Fujihira | 257/139 |
| 5,306,937 | 4/1994 | Nishimura | 257/335 |
| 5,319,222 | 6/1994 | Shekar | 257/139 |
| 5,338,693 | 8/1994 | Kinzer et al. | 437/29 |

FOREIGN PATENT DOCUMENTS

| 0255970 | 2/1988 | European Pat. Off. |
| 62-126674 | 6/1987 | Japan . |
| 62-213272 | 9/1987 | Japan . |
| 62-229866 | 10/1987 | Japan . |
| 62-281470 | 12/1987 | Japan . |
| 0102355 | 5/1988 | Japan | 257/900 |
| 63-122174 | 5/1988 | Japan . |
| 63-166271 | 7/1988 | Japan . |
| 1-270359 | 10/1989 | Japan . |
| 2288366 | 11/1990 | Japan . |
| 324737 | 2/1991 | Japan . |
| 3126263 | 5/1991 | Japan . |
| 4-142040 | 5/1992 | Japan . |
| 2193597 | 2/1988 | United Kingdom . |
| 2199694 | 7/1988 | United Kingdom . |

*Primary Examiner*—Wael Fahmy
*Attorney, Agent, or Firm*—Cushman Darby & Cushman IP Group of Pillsbury Madison & Sutro LLP

[57] ABSTRACT

The present invention involves a vertical type semiconductor device whereby miniaturization and lowered ON resistance of a cell within the device can be achieved without impairing the functioning of the device. The line width of the gate electrode is made smaller to meeting the demand for miniaturization of the cell while the distance between the channel regions which are diffused into the portions below the gate during double diffusion remains virtually equal to that in the device of larger cell size having a low $J_{FET}$ resistance component. While the width of the gate electrode is set to be smaller, the mask members used during double diffusion are attached to the side walls of the gate electrode, where their width allows the source region to diffuse to the portion under the gate. Accordingly, miniaturization and lowered ON resistance of the cell can be achieved without impairing the functioning of the device.

10 Claims, 31 Drawing Sheets

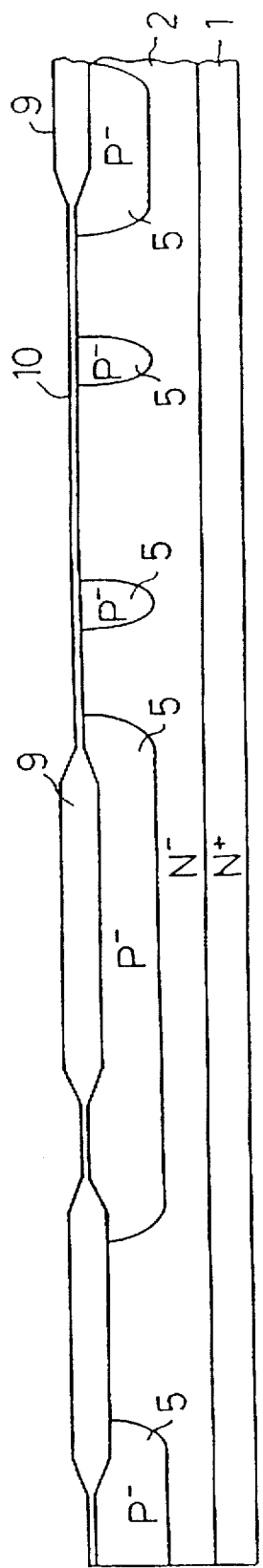

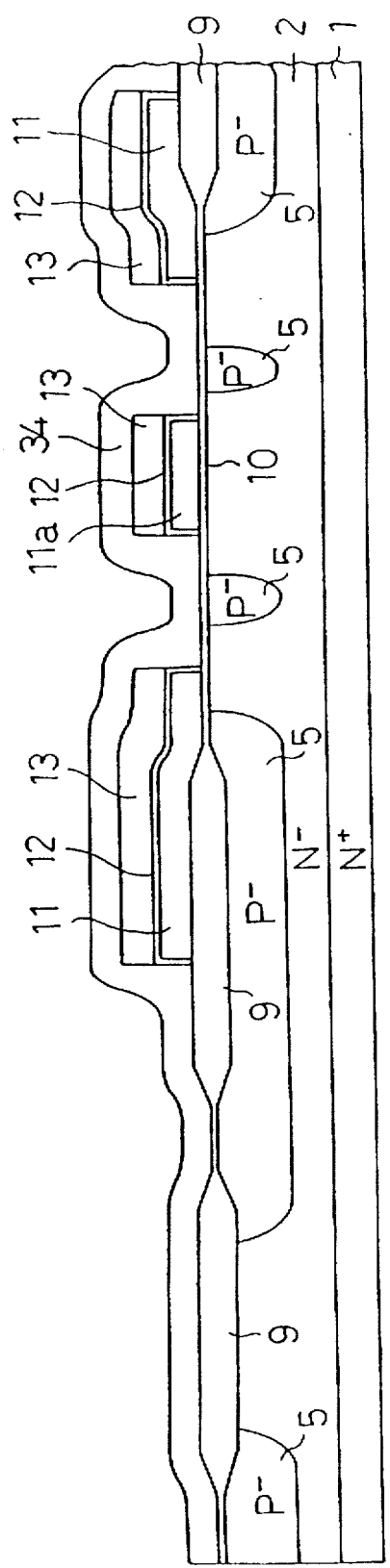
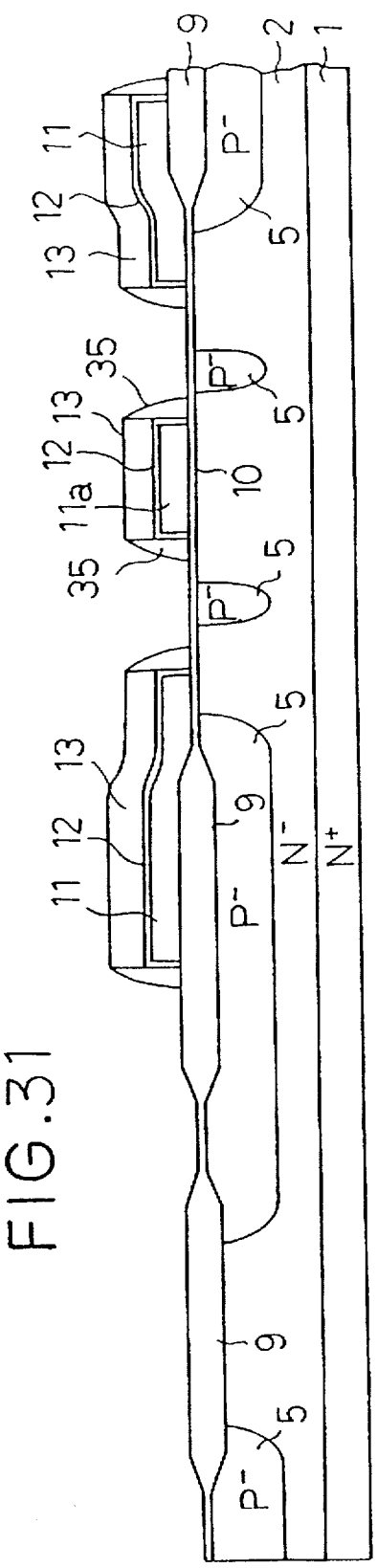
FIG.30
FIG.31

VERTICAL TYPE SEMICONDUCTOR DEVICE AND GATE STRUCTURE

CROSS-REFERENCE TO RELATED APPLICATIONS

This is a continuation of application Ser. No. 08/038,096, filed on Mar. 30, 1993, now abandoned, which was abandoned upon the filing hereof and which is a continuation-in-part of application Ser. No. 07/767,313 filed Sep. 30, 1991, granted as U.S. Pat. No. 5,250,449.

BACKGROUND OF THE INVENTION

1. Field of the Invention

The present invention relates to a vertical type semiconductor device and a method for producing the same.

2. Description of Related Arts

Various technologies have been developed for lowering the ON resistance $R_{on}$, the resistance in the operating state, of a power MOS, especially of a vertical type DMOS (double Diffused MOS) transistor. The ON resistance $R_{on}$ of a vertical MOS transistor, as shown in FIG. 16, consists of the following components:

$$R_{on} = R_{cont} + R_s + R_{ch} + R_D + R_{JFET} + R_{epi} + R_{sub} + R_B \ldots \quad (1)$$

where $R_{cont}$ represents the contact resistance, $R_s$ the source resistance, $R_{ch}$ the channel resistance, $R_D$ the depletion resistance, $R_{JFET}$ the JFET resistance, $R_{epi}$ the epitaxial layer resistance, $R_{sub}$ the substrate resistance, and $R_B$ the back side contact resistance.

The channel resistance $R_{ch}$ is given by the following expression (refer to "IEEE Transactions on Electron Devices", Vol. ED-27, No. 2, pp. 356-367, published in February, 1980).

$$R_{ch} = \frac{1}{(W/L_{eff})C_{ox}E(V_G - V_{TE})}, \quad (2)$$

where W represents the channel width, $L_{eff}$ the effective channel length given by $K(X_{chpj} - X_{N+j})$, where $X_{chpj}$ represents the diffusion depth of the P⁻ channel region 41, $X_{N+j}$ the diffusion depth of the N⁺ source region 42, and K a constant below unity (refer to FIG. 17), $C_o$ the gate capacity per unit area, $\mu_E$ the mobility, $V_{THE}$ the threshold voltage, and $V_G$ the gate voltage.

The depletion resistance RD is expressed as $$R_D = \frac{1}{3} \cdot \frac{1}{(W/L_{eff}')C_{ox}D(V_G - V_{TD})}, \quad (3)$$

where $L_{eff}'$ represents the depletion mode effective channel length, $\mu_D$ the mobility of the accumulation layer, and $V_{TD}$ the depletion mode threshold voltage.

$J_{FET}$ resistance $R_{JFET}$ is expressed as $$R_{JFET} = \frac{\rho}{W} \left[ \frac{1}{\sqrt{1 - [2X_{chpj}/(L_G + 0.3X_{chpj})]}} \times \right. \quad (4)$$

$$\left. \tan^{-1}(0.414) \sqrt{\frac{L_G + 2.3X_{chpj}}{L_G - 1.7X_{chpj}}} - \frac{\pi}{8} \right]$$

where $L_G$ represents the line width of the polysilicon gate electrode member 43 (refer to FIG. 17) and $\rho$ represents the specific resistance of epitaxial layer.

Epitaxial layer resistance $R_{epi}$ is expressed as $$R_{epi} = \frac{\rho}{2W} \cdot \frac{1}{\tan\alpha} \ln\left(1 + 2 \cdot \frac{h}{a} \tan\alpha \right), \quad (5)$$

where α, a, and h represent constants.

Reduction in the ON resistance $R_{on}$ is achieved, with respect to the channel resistance $R_{ch}$, for example, by decreasing the diffusion depth $X_{chpj}$ of the P⁻ channel region 41 or by increasing the diffusion depth $X_{N+j}$ of the N⁺ source region 42 to decrease Lef as shown in FIG. 17, according to the expression (2). As to the JFET resistance $R_{JFET}$, the JFET resistance $R_{JFET}$ can be reduced by increasing the line width $L_G$ of the polysilicon gate electrode 43 or by increasing the concentration of epitaxial layer (that means lowering the specific resistance ρ), according to expression 4. Further, as to the epitaxial layer resistance $R_{epi}$, the epitaxial layer resistance $R_{epi}$ can be reduced by increasing the concentration of epitaxial layer (that means lowering the specific resistances ρ), according to expression 5.

SUMMARY OF THE INVENTION

However, if the diffusion depth $X_{chpj}$ of the P⁻ channel region 41 shown in FIG. 17 is decreased or the epi concentration is increased, then the source-drain withstand voltage of the device is lowered. Further, if the diffusion depth $X_{N+j}$ of the N⁺ source region 42 is increased, with the diffusion depth $X_{chpj}$ of the P⁻ channel region 41 remaining unchanged, the withstand voltage, such as the punchthrough voltage, is lowered. Further, if the line width $L_G$ of the polysilicon gate electrode member 43 is increased, a problem arises that the degree of circuit integration is lowered. If the diffusion depth $X_{N+j}$ of the N⁺ source region 42 is decreased to achieve miniaturization of the unit cell, the sheet resistance $R_s$ of the N⁺ source region 42 is increased.

An object of the present invention is to achieve lowered ON resistance and miniaturization of the unit cell (higher degree of circuit-integration) of a vertical type semiconductor device while maintaining its performance.

A vertical type semiconductor device according to the present invention comprises an electrode member having a predetermined width disposed on a semiconductor substrate with an insulating film interposed therebetween, an insulating mask member having a predetermined width formed on each side of the electrode member, a first impurity region formed within the semiconductor substrate below the electrode member by introducing an impurity of a first conduction type with the electrode member and mask member used as the mask, and a second impurity region formed within the first impurity region, in the shallower position and in the narrower range than the same, below the electrode member by introducing an impurity of a second conduction type with the electrode member and mask member used as the mask.

Further, a method for producing a vertical type semiconductor device according to the present invention comprises a first step of forming an insulating film on a semiconductor substrate and forming an electrode member with a predetermined width on the insulating film, a second step of forming an insulating mask member with a predetermined width on each side of the electrode member, and a third step of forming a first impurity region within the semiconductor substrate below the electrode member by introducing an impurity of a first conduction type with the electrode member and mask member used as the mask and forming a second impurity region within the first impurity region, in the shallower position and in the narrower range than the same, below the electrode member by introducing an impurity of a second conduction type with the electrode member and mask member used as the mask.

Therefore, according to the present invention, the distance between adjoining edge portions of the first impurity regions under the electrode member is prolonged by the length masked by the mask members, with parameters such as diffusion depths of the first and second impurity regions remaining unchanged. In other words, the cell size can be reduced while the distance between the edge portions of the first impurity regions is kept constant.

Even if the cell size is reduced, the area of contact can be secured by the insulating mask member disposed on the side portion of the electrode being of a predetermined width.

Thus, according to the present invention, lowered ON resistance and miniaturization of the unit cell (higher degree of circuit integration) can be achieved while maintaining the performance of the device.

BRIEF DESCRIPTION OF THE DRAWINGS

FIG. 2 to FIG. 15 are diagrams showing the production process of the semiconductor device of the first embodiment;

FIG. 30 to FIG. 32 are diagrams showing the production process of a semiconductor device of a third embodiment;

DESCRIPTION OF THE PREFERRED EMBODIMENTS

The present invention will be described below as related to embodiments shown in the accompanying drawings.

[First Embodiment]

A first embodiment of the present invention will now be described below with reference to the accompanying drawings.

Figure 1:
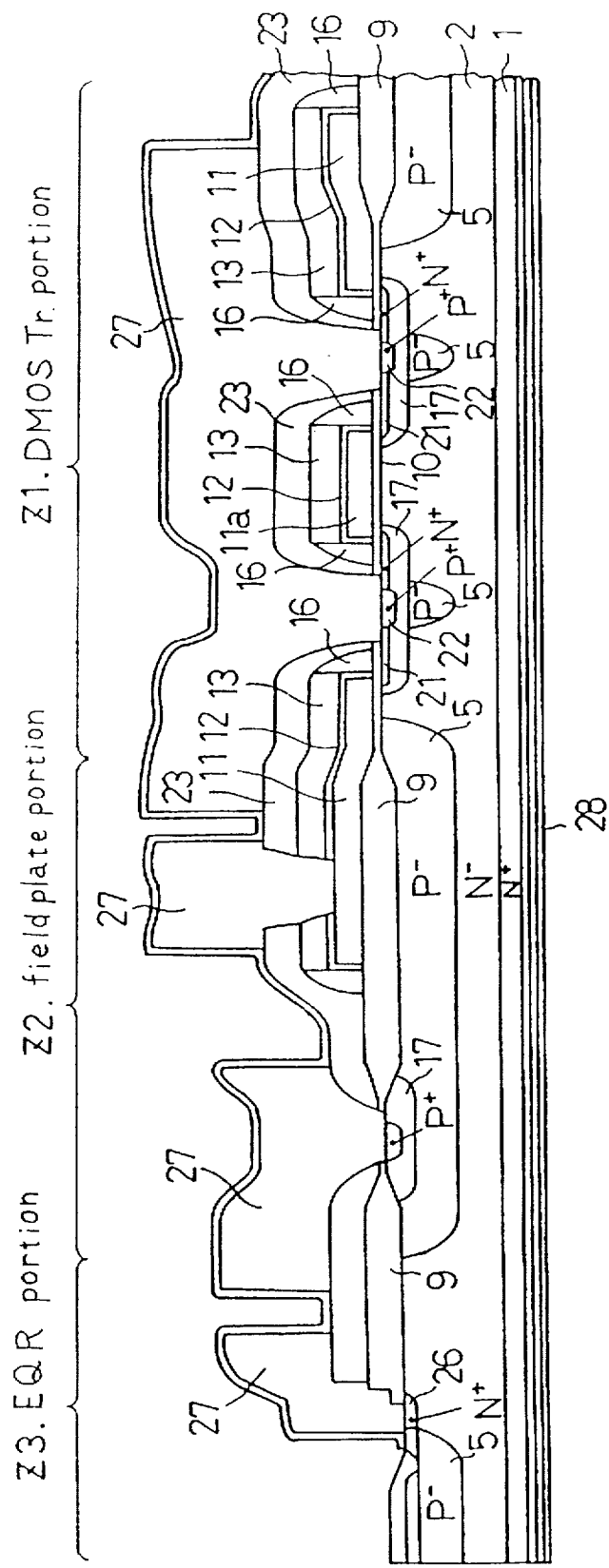
FIG. 1 is a sectional view of a semiconductor device according to a first embodiment.

A semiconductor device having an N-channel vertical type DMOS transistor portion Z1 is shown in FIG. 1, in which a field plate portion Z2 and a peripheral portion (equivalent ring; EQR portion) Z3 are shown in addition to the DMOS transistor portion Z1. FIG. 2 to FIG. 15 show the production process of the device. Description will be given below according to the production process taking a case where the withstand voltage is set to around 60 V as an example.

Figure 2:
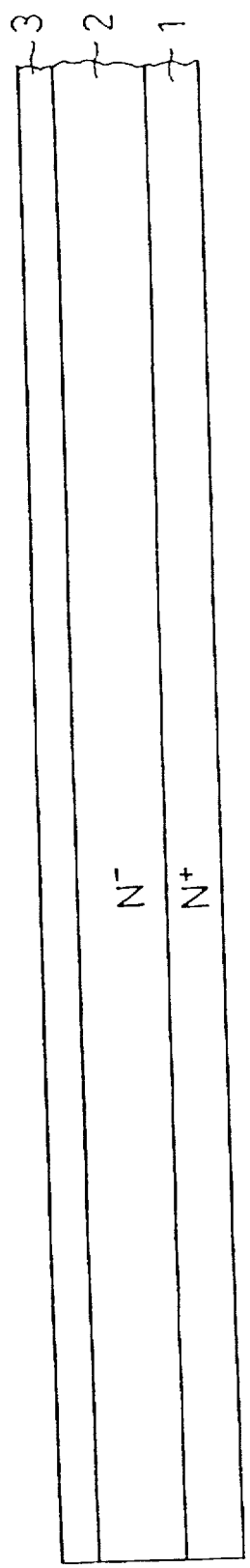

As shown in FIG. 2, an $N^+$ silicon substrate 1 is prepared and, over the same, an $N^-$ epitaxial layer 2 is formed. Thereafter, a silicon oxide film 3 is formed to a thickness of around 3000 to 5000 Å over the $N^-$ epitaxial layer 2.

Figure 3:
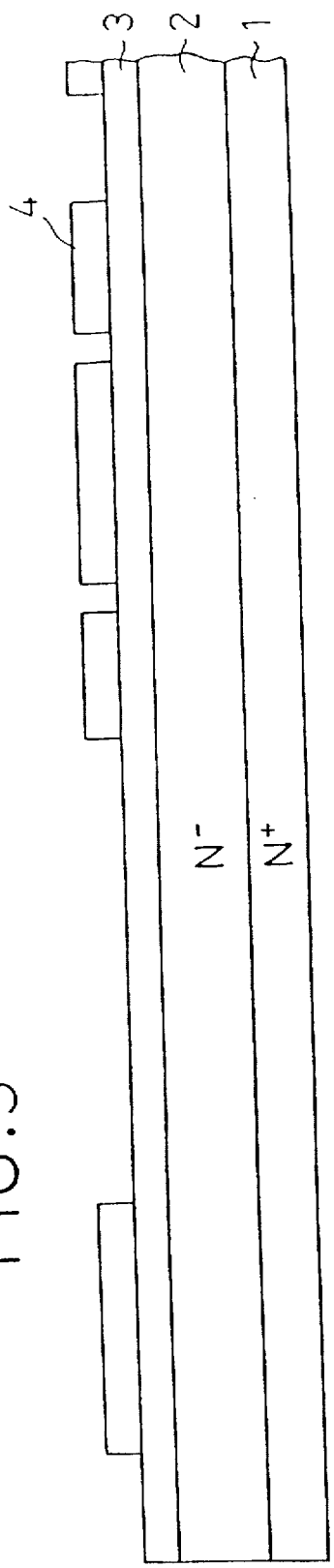
Figure 4:
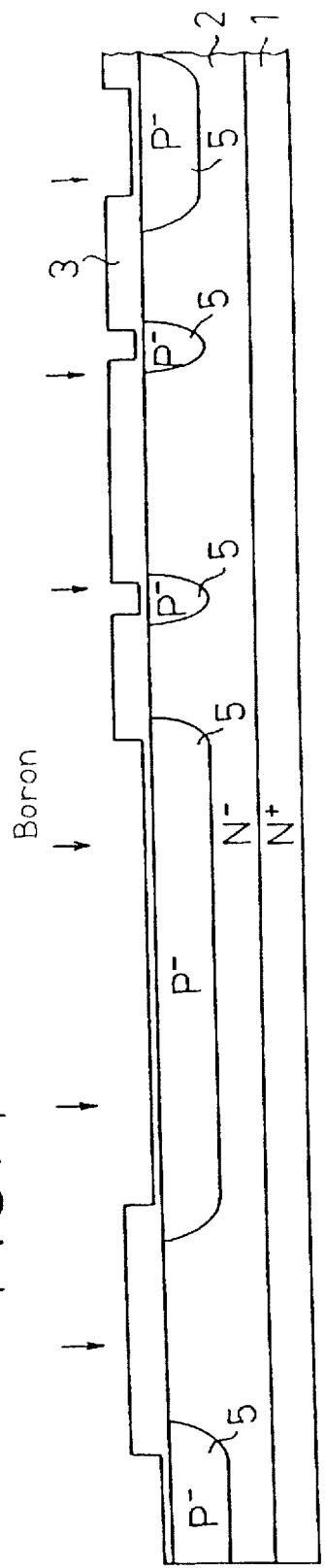

Then, as shown in FIG. 3, photo etching is applied to the silicon oxide film 3 using a resist 4 for forming a deep $P^-$ well layer. Thereafter, as shown in FIG. 4, boron ions are implanted under the condition of $3\times10^{13}$ cm$^{-2}$ dose at 60 keV and drive in (1170° C., 4–6 hours, $N_2$) is performed, whereby a deep $P^-$ well layer 5 is formed.

Figure 5:
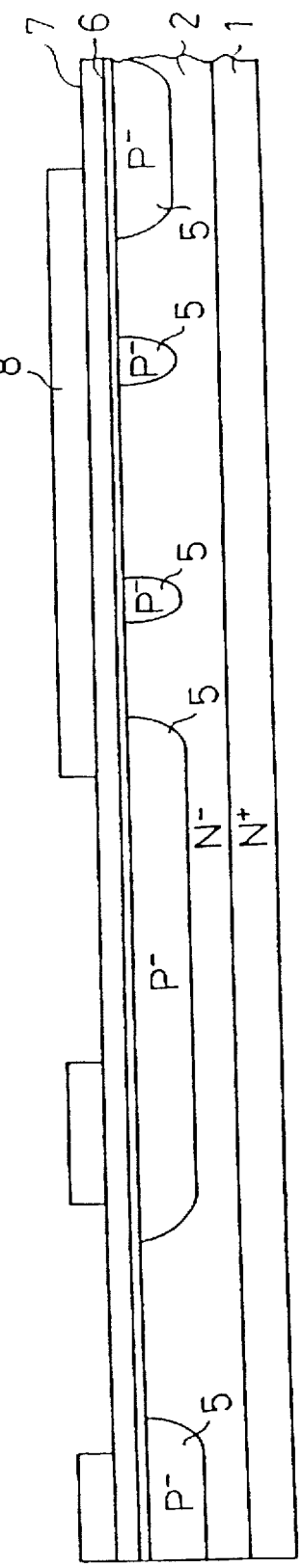

Then, as shown in FIG. 5, the silicon oxide film 3 is removed and a pad oxide film 6 is formed on the surface of the epitaxial layer 2 to a thickness of around 300 to 500 Å. Over the same, a silicon nitride film ($Si_3N_4$ film) is deposited to a thickness of around 1000 to 2000 Å. Thereafter, the silicon nitride film 7 is subjected to patterning by photo-etching with a resist 8. Then, as shown in FIG. 6, a field oxide film 9 is formed to a thickness of around 9000 to 10000 Å by LOCOS oxidation. Thereafter, the silicon nitride film 7 is removed with hot phosphoric acid and the pad oxide film 6 is removed by etching with HF or the like applied to the entire surface, and in succession, a gate oxide film 10 is formed to a thickness of around 300 to 1000 Å.

Then, as shown in FIG. 7, a polysilicon film 11 is deposited on the entire surface to a thickness of around 5000 to 10000 Å by LPCVD method and a phosphor diffusion treatment so that the polysilicon film 11 is turned into a phosphor doped polysilicon film 11. The surface of the phosphor doped polysilicon film 11 is then thermally oxidized so that a polysilicon oxide film 12 is formed to a thickness of around 500 to 1500 Å. A silicon oxide film 13 is formed over the phosphor doped polysilicon film 11 by CVD to a thickness of around 1 μm.

Figure 8:
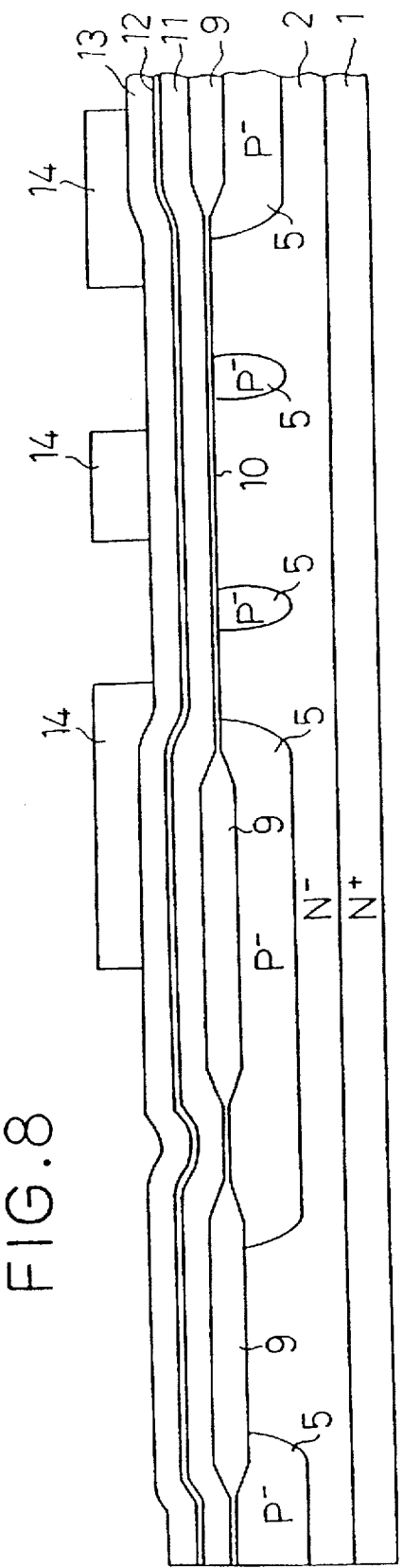
Figure 9:
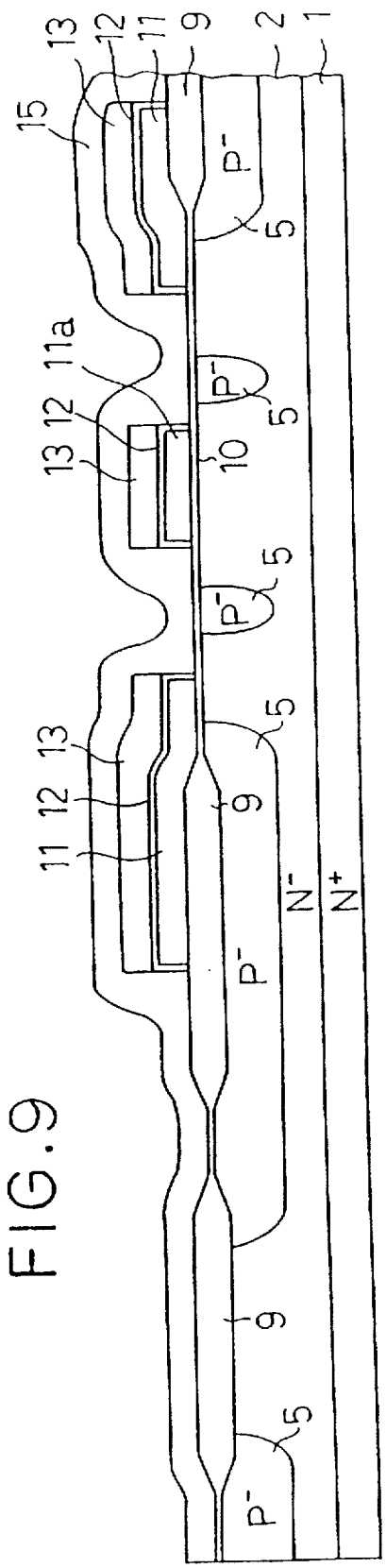

Then, as shown in FIG. 8, a patterning treatment is applied to the phosphor doped polysilicon film 11, polysilicon oxide film 12, and silicon oxide film 13 using a resist 14. As a result, as shown in FIG. 9, there is formed a phosphor doped polysilicon electrode member (hereinafter briefly called "polysilicon gate electrode member") 11a disposed in the region for forming the transistor on the epitaxial layer 2 with the gate oxide film 10 interposed therebetween. Further, in FIG. 9, the peripheral wall portion of the phosphor doped polysilicon electrode member 11a is thermally oxidized after the patterning and, thereby, a polysilicon oxide film is formed there.

Figure 10:
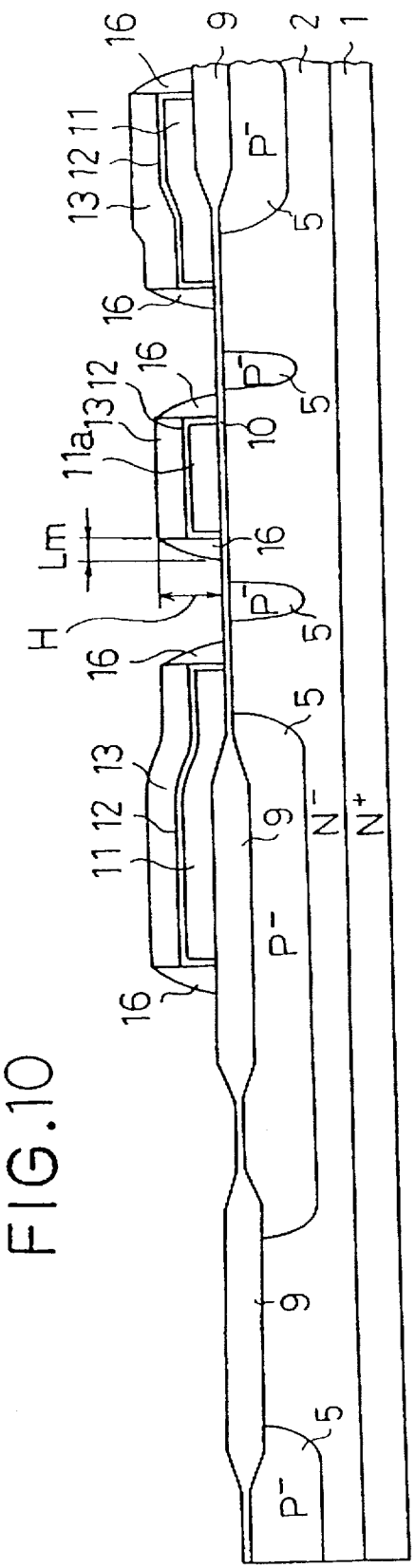

Thereafter, a CVD silicon oxide film 15 of TEOS having a good step covering characteristic is formed on the entire surface to a thickness of around 1 μm. Then, as shown in FIG. 10, the CVD silicon oxide film 15 is subjected to an etchback treatment by dry etching, and as a result, mask members 16 of the CVD silicon oxide film 15 are formed on the side portions of the phosphor doped polysilicon film 11 (including the polysilicon gate electrode member 11a).

The width $L_m$ of the mask member 16 at its bottom depends on the thickness H of the laminated film of the phosphor doped polysilicon film 11, polysilicon oxide film 12, and silicon oxide film 13. Further, the width $L_m$ of the mask member 16 is set to less than 0.85 times the depth of the N⁺ source region 21 in FIG. 1. That is, as stated in "IEEE Transactions on Electron Devices", Vol. ED-27, No. 2, pp. 356–367, published in February, 1980, the lateral diffusion is set to 0.85 times the vertical diffusion, and setting the width $L_m$ to less than 0.85 time the depth of the N⁺ source region 21 provides the condition for forming the N⁺ source region 21 below the polysilicon electrode member 11a.

Figure 11:
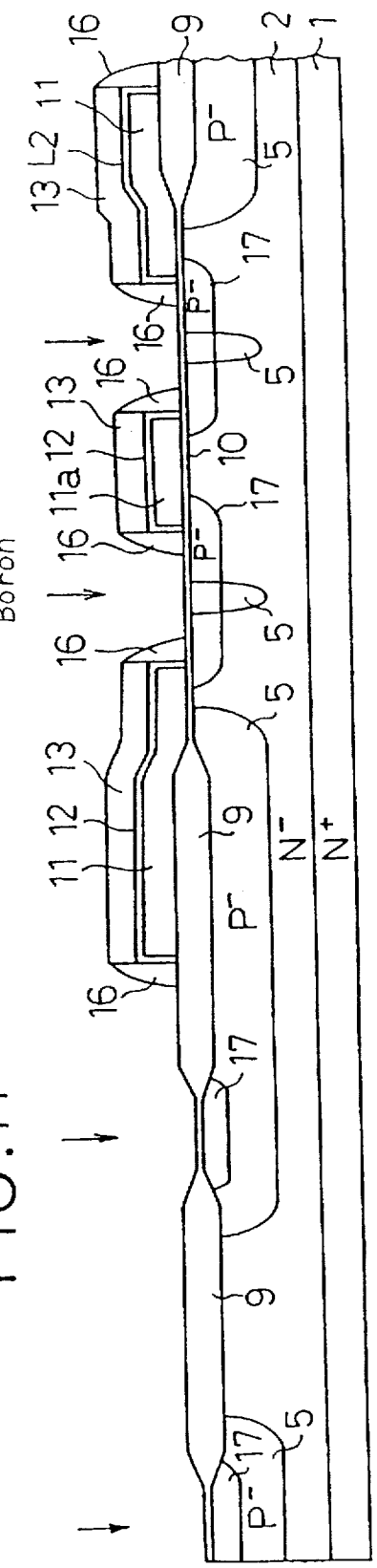
Figure 12:
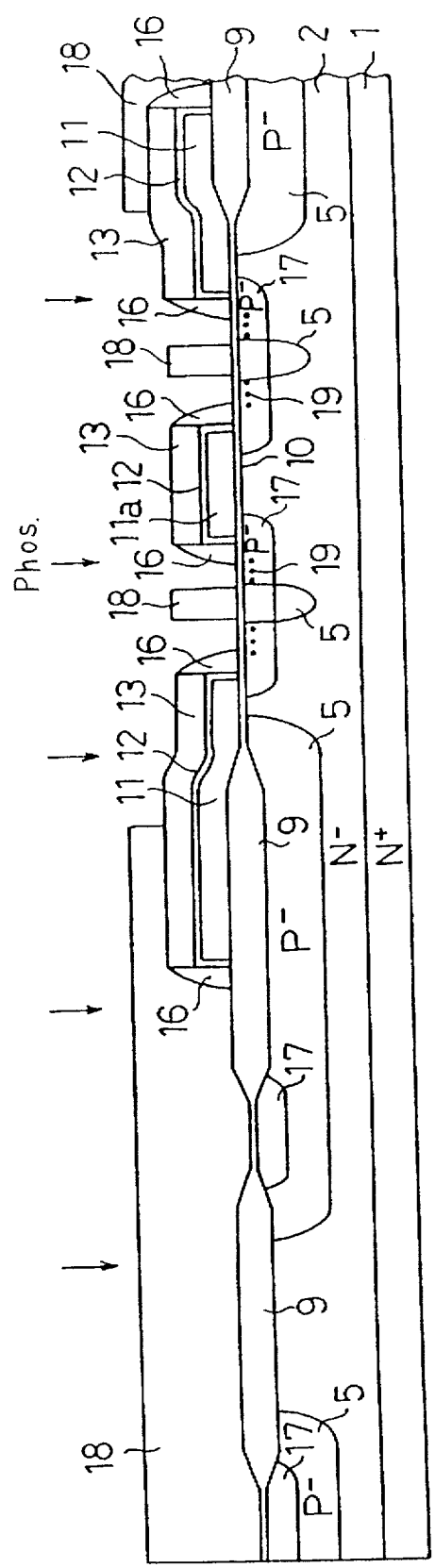

Then, as shown in FIG. 11, boron ions are implanted into the entire surface (maskless) under the condition of 6×10¹³ to 9×10¹³ cm⁻² dose at 40 keV, and further, drive in is performed at 1170° C. for about 60 minutes, whereby a P⁻ channel region 17 is formed. Thereafter, as shown in FIG. 12, phosphor ions are implanted under the condition of 5×10¹⁵ cm⁻² dose at 130 kev using a mask 18 patterned by photolithography, and thereby an N⁺ implanted region 19 is formed.

Figure 13:
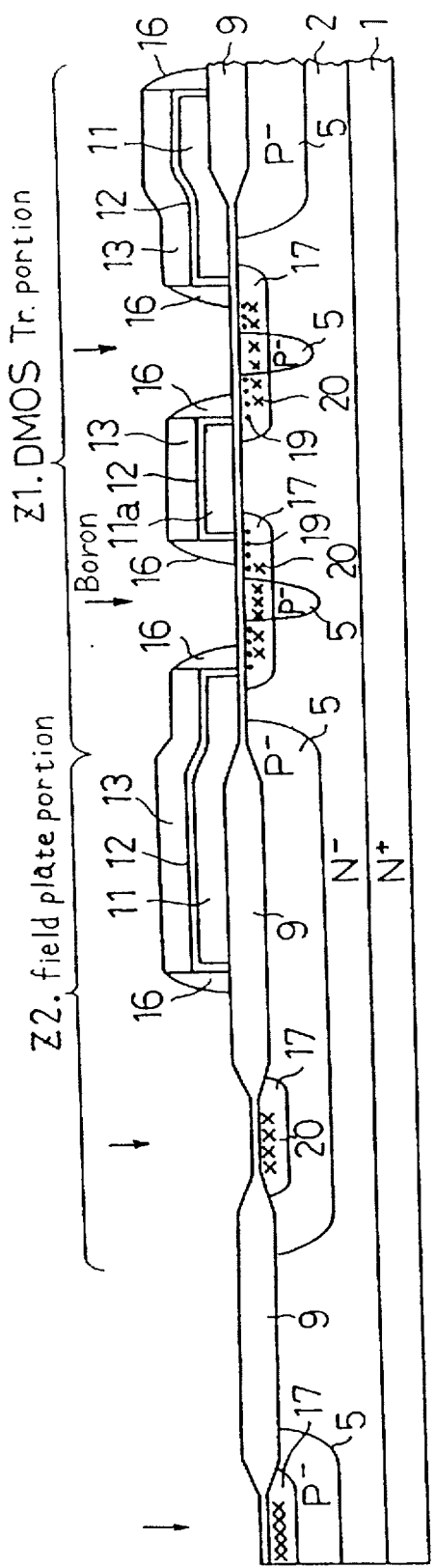

Then, as shown in FIG. 13, boron ions are implanted into the entire surface for forming a body contact with the P⁻ channel region 17 in the DMOS transistor portion Z1 and a contact in the field plate portion Z2 under the condition of around 6×10¹⁴ cm⁻² dose at 60 KeV. P⁺ implanted regions 20 are formed accordingly.

Figure 14:
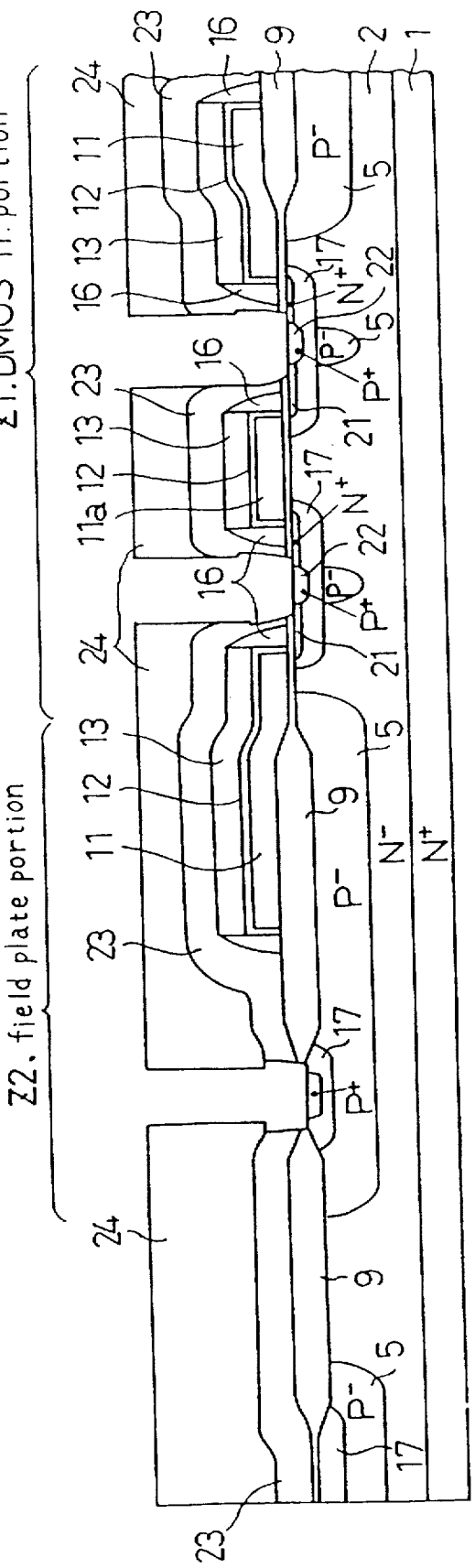

Then, as shown in FIG. 14, a heat treatment is performed in N₂ so that N⁺ source regions 21 and a P⁺ contact region 22 are formed. At this time, if the heat treatment is performed at 1000 to 1050° C. for one hour, for example, the N⁺ source region 21 and P⁺ contact region 22 reach a depth of around 0.7 to 1.2 μm. Although the N⁺ source region 21 is also implanted with boron ions, phosphor is around 10 times as high in ion concentration as boron, and the boron of such concentration has little effect in the N⁺ source region 21.

Then, a BPSG film 23 is applied to the entire surface and specified portions of the BPSG film 23 are removed by photoetching (wet or dry etching) using a resist 24. In this photoetching process, holes are made at the contact portion in the DMOS transistor portion Z1 and the contact portion in the field plate portion Z2.

Figure 15:
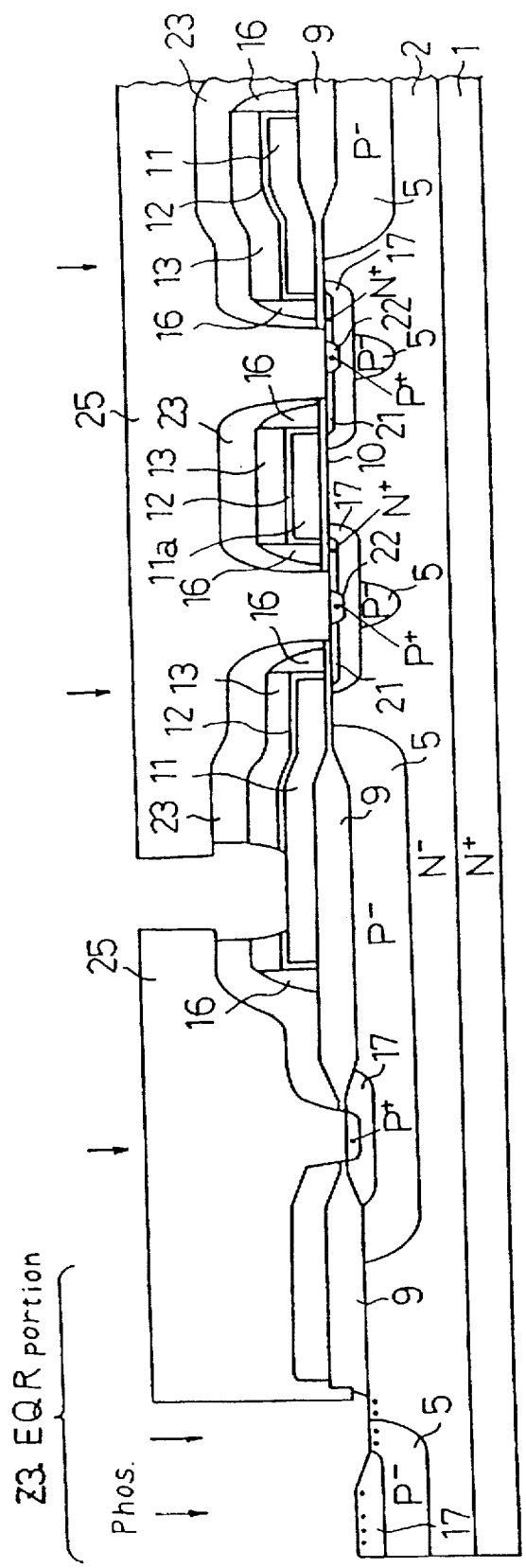
Figure 16:
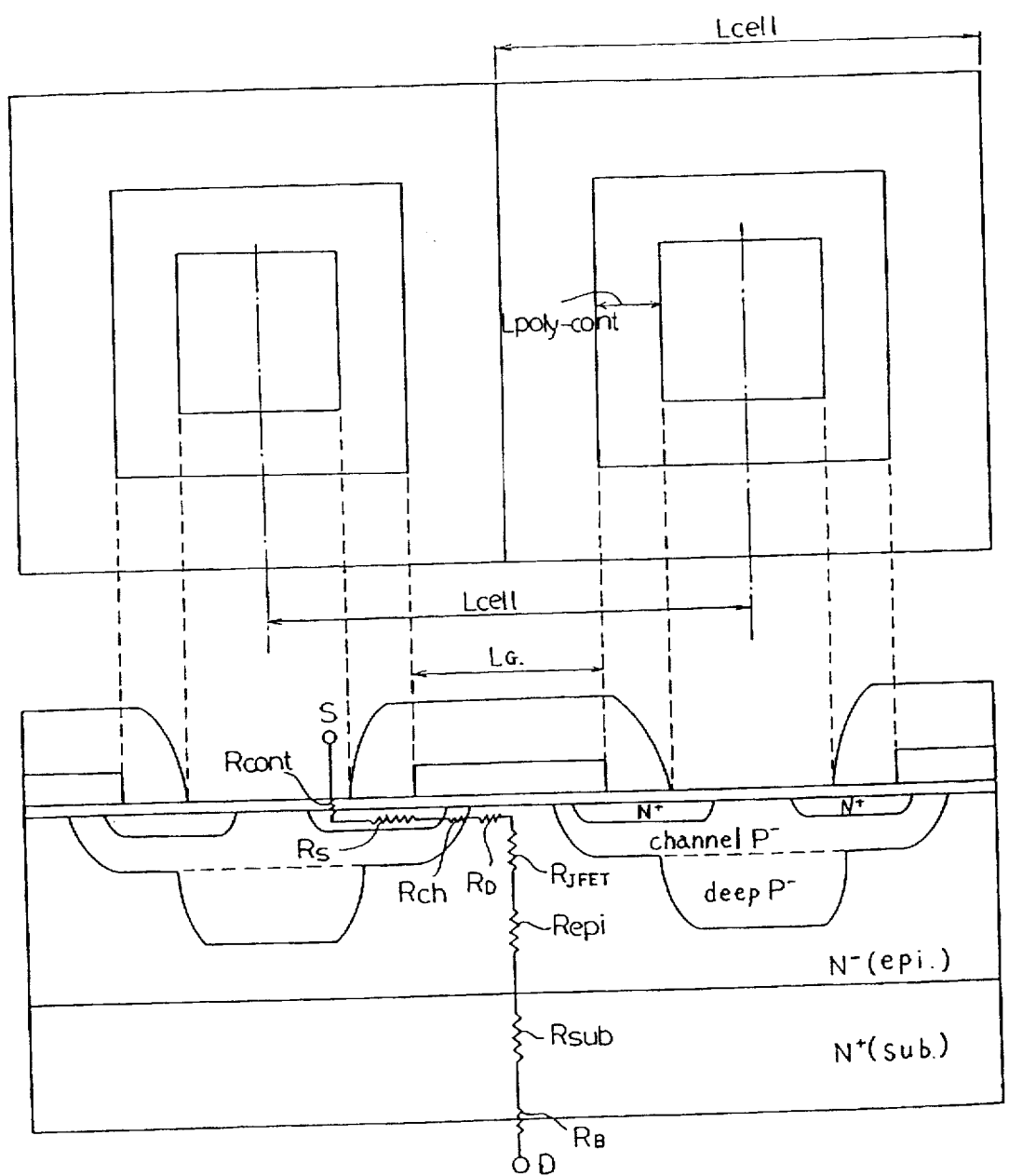
FIG. 16 and FIG. 17 are diagrams showing a semiconductor device.

In succession thereto, as shown in FIG. 15, photoetching using a resist 25 is performed to obtain a contact with the phosphor doped polysilicon film 11. At this time, a hole is simultaneously made in the peripheral portion (EQR portion) Z3.

The reason why the photoetching for the contact in the DMOS transistor portion Z1 (shown in FIG. 14) and the photoetching for the contact with the phosphor doped polysilicon film 11 (shown in FIG. 15) are performed separately is that the etching conditions are much different. Namely, when it is attempted to form the mask member 16 having the width $L_m$ around 1 μm, it is required that the piled film of the phosphor doped polysilicon film 11, polysilicon oxide film 12, and silicon oxide film 13 has the film thickness H around 1.5 μm as shown in FIG. 10. Therefore, the contact to the phosphor doped polysilicon film 11 becomes thicker than the contact portion in the DMOS transistor portion Z1 by the thickness of the insulating film (the polysilicon oxide film 12 and silicon oxide film 13).

Then, in FIG. 15, phosphor ion implantation for forming an N⁺ contact in the peripheral portion (EQR portion) Z3 is performed under the same conditions as in the formation of the N⁺ source region 21 and then annealing is performed, whereby the N⁺ layer 26 as shown in FIG. 1 is formed. Thereafter, the aluminum electrode 27, a passivation film (not shown), and the drain electrode 28 on the back face are formed.

Through the described process, a semiconductor device with integrated vertical type DMOS power transistors is completed.

In the semiconductor device produced as described above, the polysilicon gate electrode member 11a is disposed on the epitaxial layer 2 through the gate oxide film 10, where member 11a has a specific width, layer 2 acts as the semiconductor substrate and film 10 acts as an insulating film. The insulating mask members 16 having a specified width are formed on both sides of the electrode member 11a. P⁻ channel regions 17 are formed as the first impurity region below the polysilicon gate electrode member 11a within the epitaxial layer 2 by boron ion implantation, where regions acts as the first impurity region. The electrode member 11a and the mask members 16, and the N⁺ source regions 21 are formed below the polysilicon gate electrode member 11au within the P⁻ channel region 17 but by phosphor ion implantation with the electrode member 11au and the mask members 16 used as the mask, where regions 21 are formed in a shallower position and in a narrower range than the region 17 to act as the second impurity region.

In short, the polysilicon gate electrode member 11a with a specified width is disposed on the epitaxial layer 2 as the semiconductor substrate with the gate oxide film 10 as the insulating film interposed therebetween. The P⁻ channel regions 17 as the first impurity region are formed below the polysilicon gate electrode member 11a within the epitaxial layer 2. The N⁺ source regions 21 as the second impurity region are formed below the polysilicon gate electrode member 11a within the P⁻ channel region 17 but in shallower position and in the narrower range than the region 17. Further, the insulating mask members 16 having the thickness 0.85 time as large as the depth of the N⁺ source region 21 are disposed on both sides of the polysilicon gate electrode member 11a.

Now, the design concept for designing the present miniaturized semiconductor device will be described.

In order to secure specifications (sourcedrain withstand voltage, sheet resistance of impurity regions) of the transistor and also to realize lowered ON resistance therein, following simulation is carried out.

The normalized ON resistance $R_n$ which is normalized by the resistance per 1 mm² is used as the ON resistance $R_{on}$. $R_n$ is expressed as $$R_n = \gamma / W_0, \ldots \quad (6)$$

where $W_0$ represents the perimeters of the channel regions per 1 mm² and γ represents the resistance per unit length.

Figure 17:
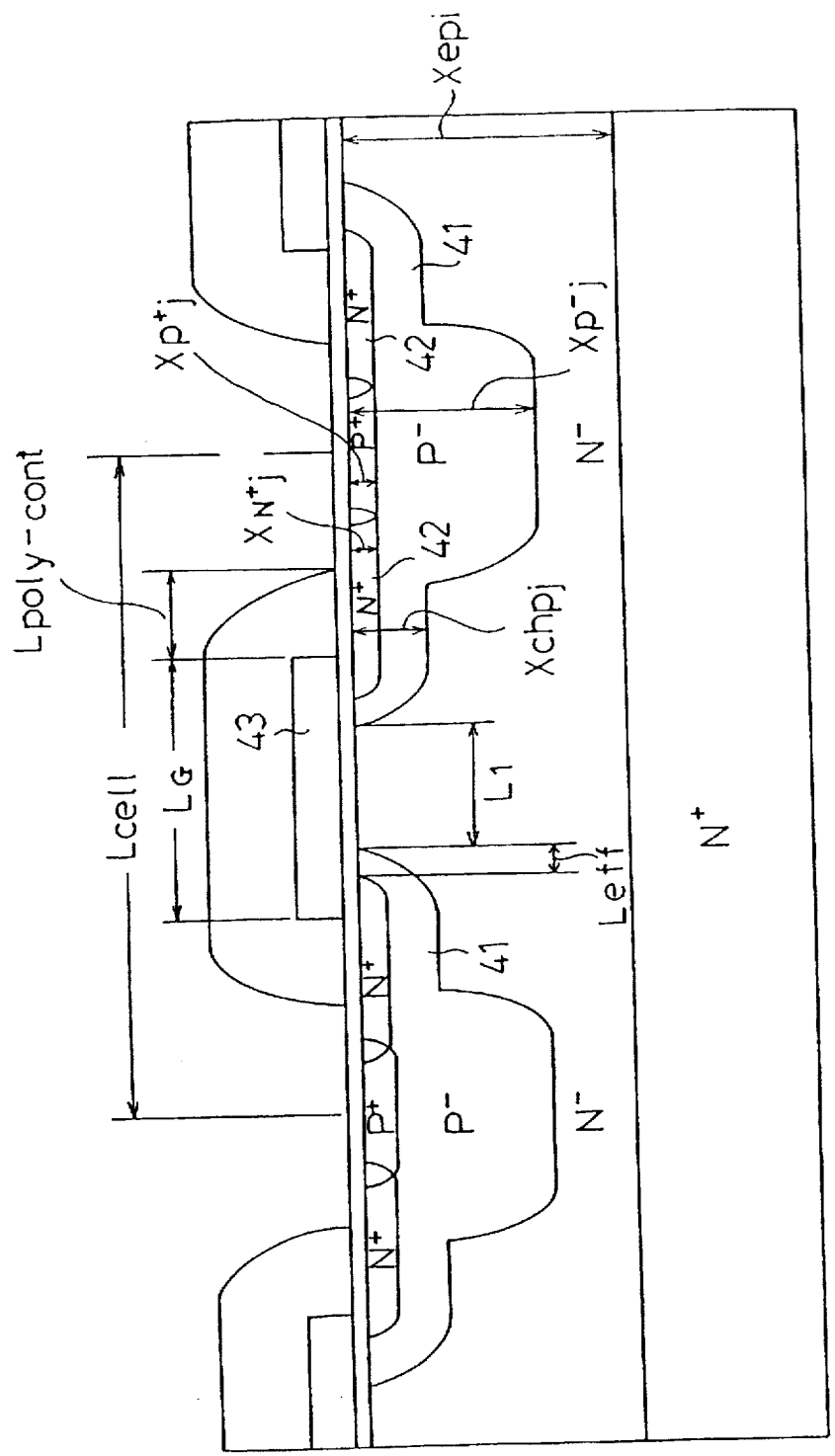

Now, considerations are described for securing the withstand voltage. For simplicity, we assume here that the diffusion depths $X_{chpj}$, $X_{p-j}$, $X_{p+j}$ of the impurities, the epitaxial layer thickness $X_{epi}$ and the epi concentration (specific resistance ρ) are all constant, and we consider the case where the cell is to be miniaturized. That is, the cell size $L_{cell}$ is to be made smaller. The value γ corresponds to the resistance value in FIG. 17 when unit length is taken in the direction perpendicular to the paper. It is therefore equal to the sum total of all the resistance values in the expression (1) per unit length.

Since the contact resistance $R_{cont}$ is inversely proportional to its area, the area cannot be reduced, and hence the area is set to be constant (5 μm square). Further, it is assumed that, when the same photo alignment apparatus is used, the distance $L_{poly-cont}$ between the polysilicon gate electrode material 43 and the contact is constant. Accordingly, to reduce the cell size $L_{cell}$ it becomes necessary to reduce the width $L_G$ (hereinafter called "gate line width") of the polysilicon gate electrode member 43. When the gate line width $L_G$ is reduced, the distance (hereinafter called "channel interval") $L_1$ between edges of the P⁻ channel regions 41 under the polysilicon gate electrode member 43 becomes smaller.

Figure 18:
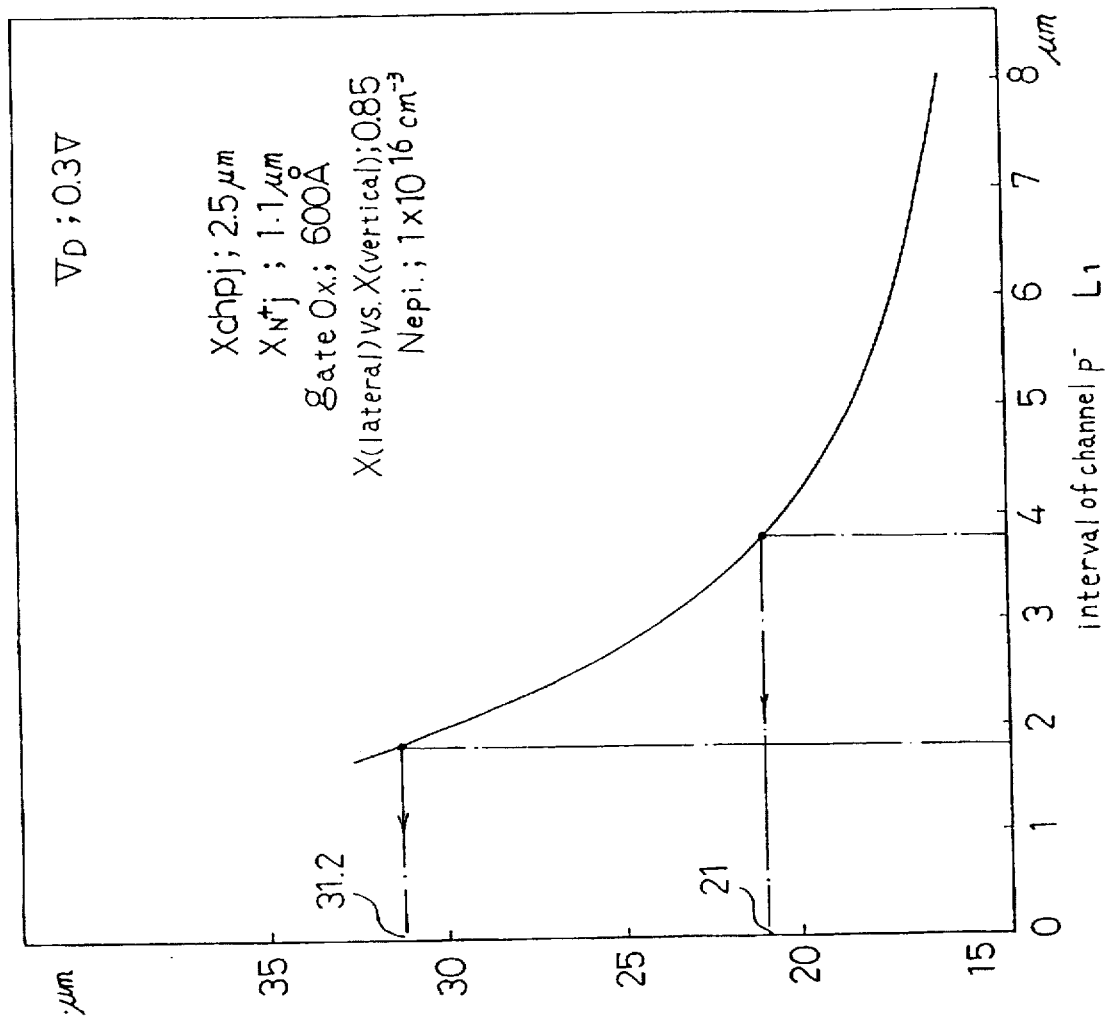
FIG. 18 is a graph showing the relationship between channel interval and resistance.

FIG. 18 shows results of two-dimensional simulation for the channel interval $L_1$ and the resistance value R' (=$R_S$+$R_{ch}$+$R_{JFET}$+$R_{epi}$). From FIG. 18, it is known that R' sharply increases unless the channel interval $L_1$ larger than around 3.5 μm is secured. More specifically, when the cell size $L_{cell}$ (gate line width $L_G$) is reduced, the channel interval $L_1$ is reduced accordingly, which leads to a sharp increase in the resistance R' ($R_{JFET}$). Accordingly, in achieving lowered ON resistance, it becomes necessary to devise miniaturization of the cell while securing the channel interval $L_1$ larger than a specified value (for example 3.8 μm).

For achieving lowered ON resistance, the following three methods can be considered from the expression (6):

(1) to increase the perimeter $W_o$ of the channel region and also to reduce the resistance γ per unit length;

(2) to reduce the resistance γ while keeping the perimeter $W_o$ as it is; and (3) to increase the perimeter $W_o$ while keeping the resistance γ as it is.

Method (3) is most effective of the three methods. That is, perimeter $W_o$ is increased while suppressing increase in the resistance γ as much as possible even if the cell size is reduced.

Figure 19:
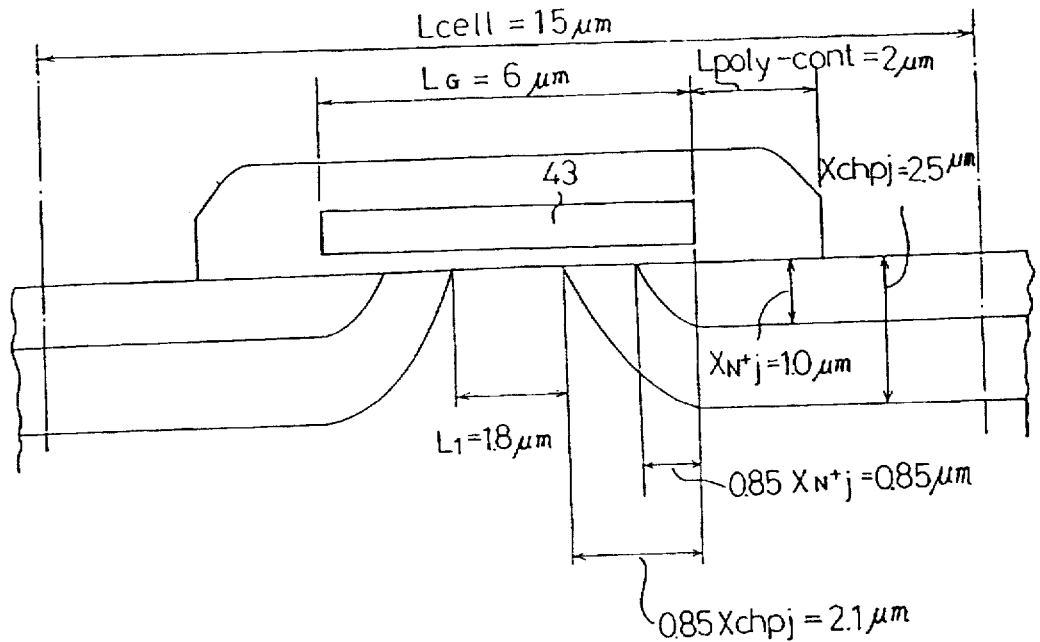
FIG. 19 and FIG. 20 are diagrams showing a semiconductor device.
Figure 20:
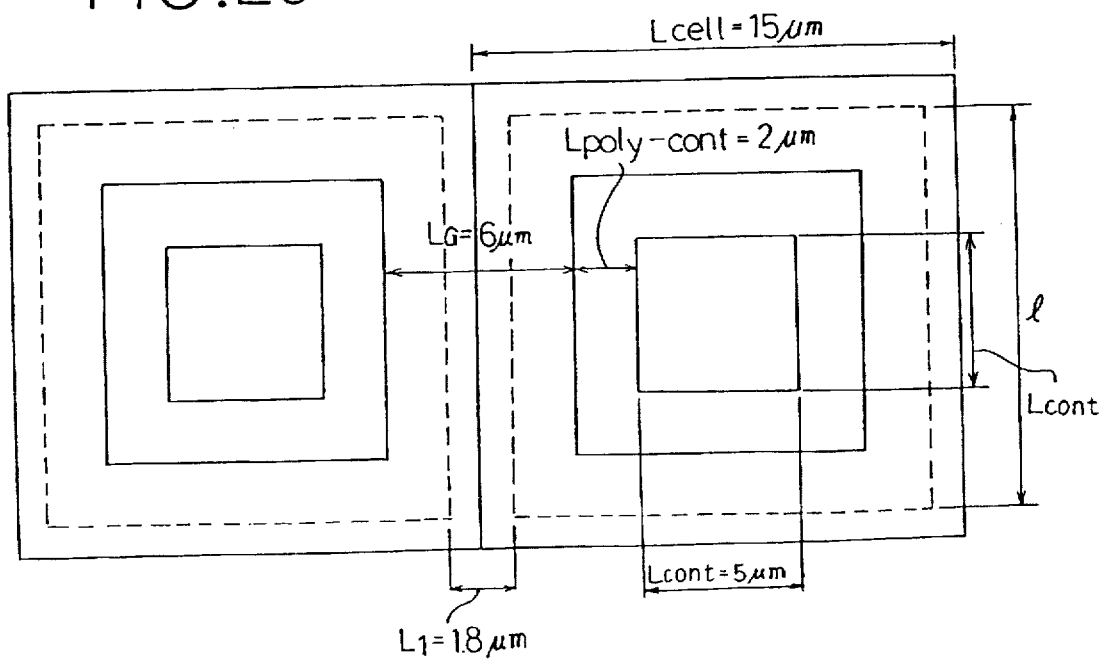

When, as shown in FIG. 19 and FIG. 20, the distance $L_{poly-cont}$ between the polysilicon gate electrode member 43 and the contact is set to 2 μm, the size of the contact is set to 5 μm square, and the gate line width $L_G$ is set to 6 μm, the cell size $L_{cell}$ becomes 15 μm. Further, $X_{N+j}$=1.0 μm, $X_{chpj}$= 2.5 μm, and lateral diffusion=vertical diffusion depth×0.85.

In FIG. 19, the channel interval $L_1$ becomes 1.8 μm due to diffusion from the edges of the polysilicon gate electrode member 43. Hence, the resistance value R' ($R_{JFET}$) becomes 31.2 kΩ-μm according to the result of simulation in FIG. 18. As a result, the resistance value becomes approximately 1.5 times (=31.2/21) as large as that when $L_1$ is 3.8 μm (refer to FIG. 18).

Figure 21:
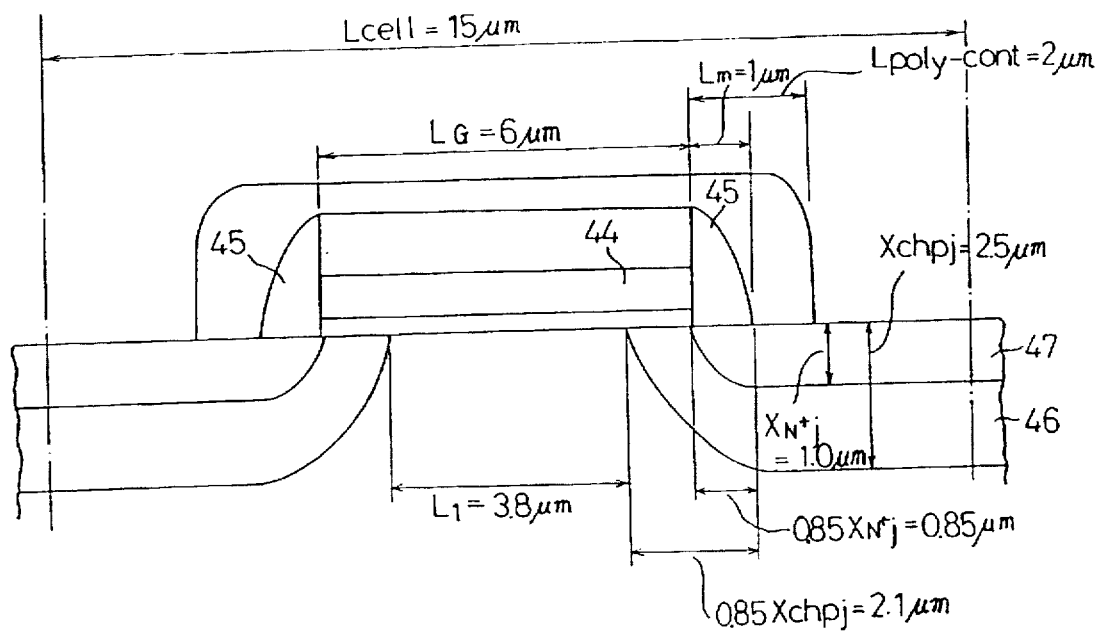
FIG. 21 and FIG. 22 are diagrams showing a semiconductor device.
Figure 22:
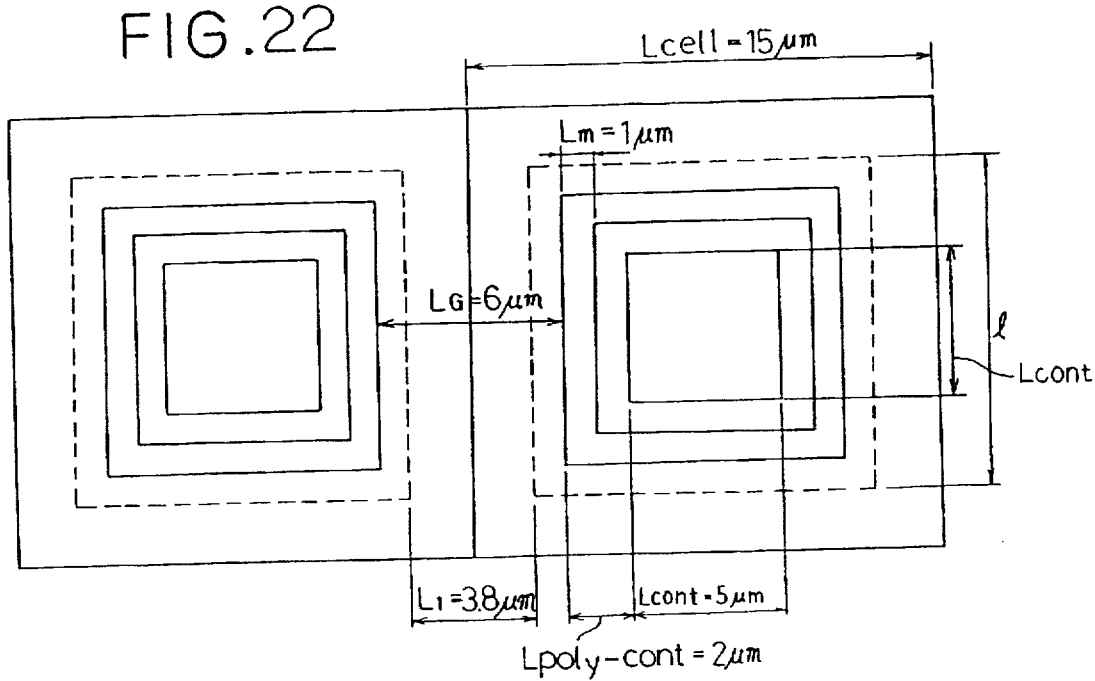

Accordingly, as shown in the device of the present embodiment in FIG. 21 and FIG. 22, insulating mask members 45 with a specified width are formed on both sides of the polysilicon gate electrode member 44. The P⁻ channel region 46 and N⁺ source region 47 are therefore formed by ion implantation using the electrode member 44 and the mask member 45 as the mask, mask member 45 having a width substantially equal to or less than a lateral diffusion distance of source region 47.

By so doing, the impurity is allowed to diffuse from the mask member 45. Hence, a specified length (3.8 μm) of the channel interval L1 can be secured even if the line width $L_G$ of the polysilicon gate electrode member 44 is reduced.

In other words, the insulating mask member 45 serves as a part of insulating member between the gate and the contact. Hence, the line width $L_G$ of the polysilicon gate electrode member 44, with the cell size and the distance $L_{poly-cont}$ between the gate electrode member 44 and the contact remains physically unchanged while being inherently prolonged by the length corresponding to twice the width of the mask member (2·$L_m$).

That is, even if the width $L_G$ is reduced, line width $L_G$ in substance becomes $L_G$+2$L_m$. Therefore, the resistance value R' ($R_{JFET}$) in FIG. 18 is prevented from increasing. Since the length $W_o$ can be increased while the device is miniaturized, lowered ON resistance can be achieved.

Figure 23:
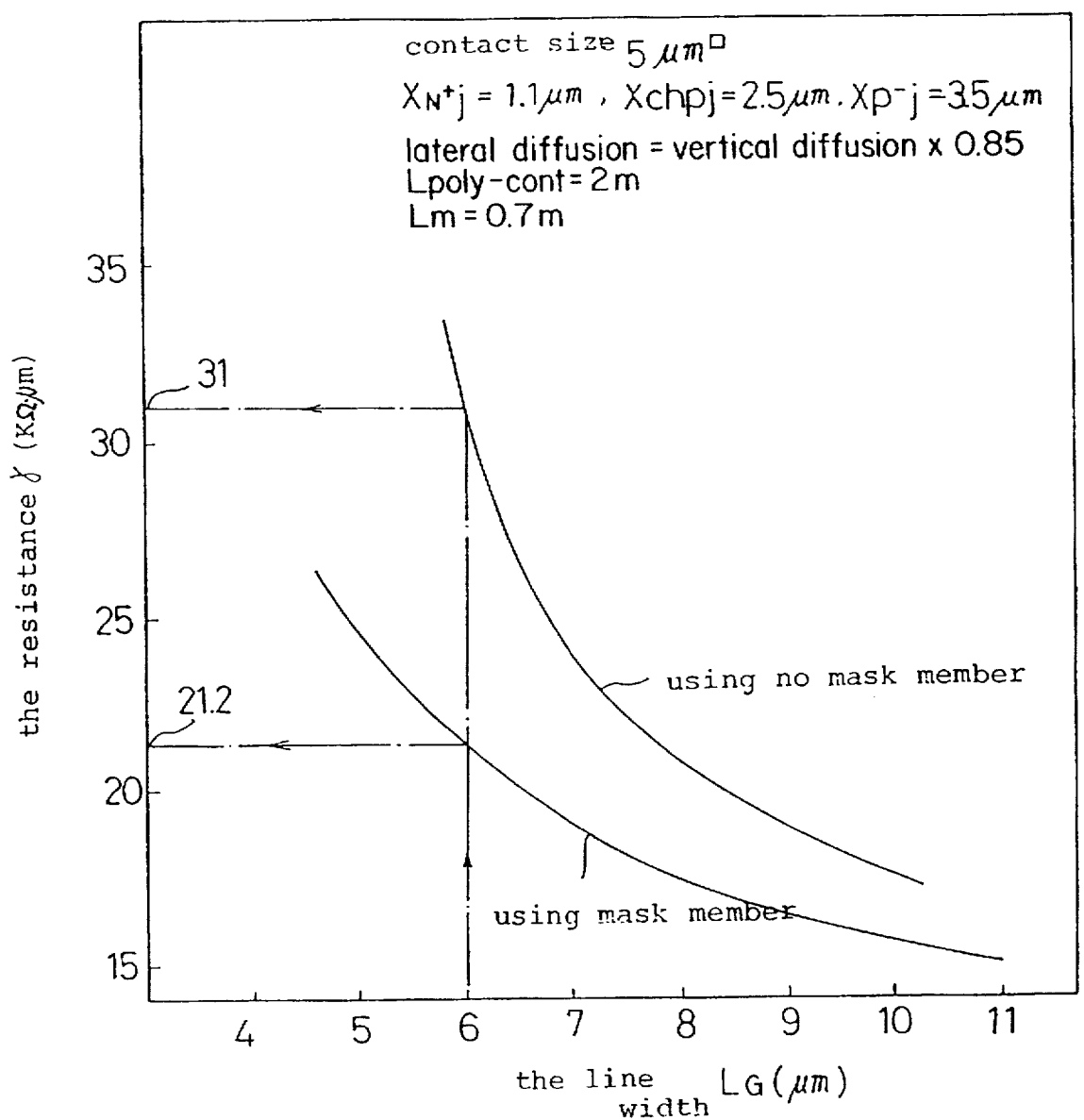
FIG. 23 is a graph showing the relationship between gate line width and resistance.

FIG. 23 shows relationships between line width $L_G$ of the gate electrode member and the resistance γ per unit length in the case where the mask member is used versus the case where it is not used. In the present case, conditions are set so that the size of the contact=5 μm square, $X_{N+j}$=1.1 μm, $X_{chpj}$=2.5 μm, $X_{p-j}$=3.5 μm, lateral diffusion=vertical diffusion×0.85, the distance $L_{poly-cont}$ between the gate electrode member and the contact=2 μm, and the width $L_m$ of the mask member=0.7 μm.

Below will be given description of the perimeter $W_o$ per 1 mm².

If, as shown in FIG. 20, the contact width is represented by $L_{cont}$, the distance between the gate electrode member and the contact by $L_{poly-cont}$ and lateral diffusion=vertical diffusion×0.85, the perimeter 4l of the channel region for one cell (l is the length of one side of the channel region in a square form measured at the edge of the lateral diffusion) is expressed as $$4l=4·(L_{cont}+2·L_{poly-cont}+2·0.85·X_{N+j}), \quad \ldots \quad (7)$$

Hence, the perimeter $W_o$ per 1 mm² is expressed as $$W_o = 4l \quad (8)$$
$$= \frac{1 \times 1}{L_{cell}2 \times 10^{-6}} \times 4 \times (L_{cont} + 2·L_{poly-cont} + 2·0.85·X_{N+j})$$

In concrete terms, if $L_{cont}$=5 μm, $L_{poly-cont}$=2 μm, and $X_{N+j}$=1.1 μm, expression (8) becomes $$W_o = \frac{43·4}{(L_G+9)^2 \times 10^{-6}} \quad (9)$$

since $L_{cell}$=$L_G$+$L_{cont}$+2·$L_{poly-cont}$

Figure 24:
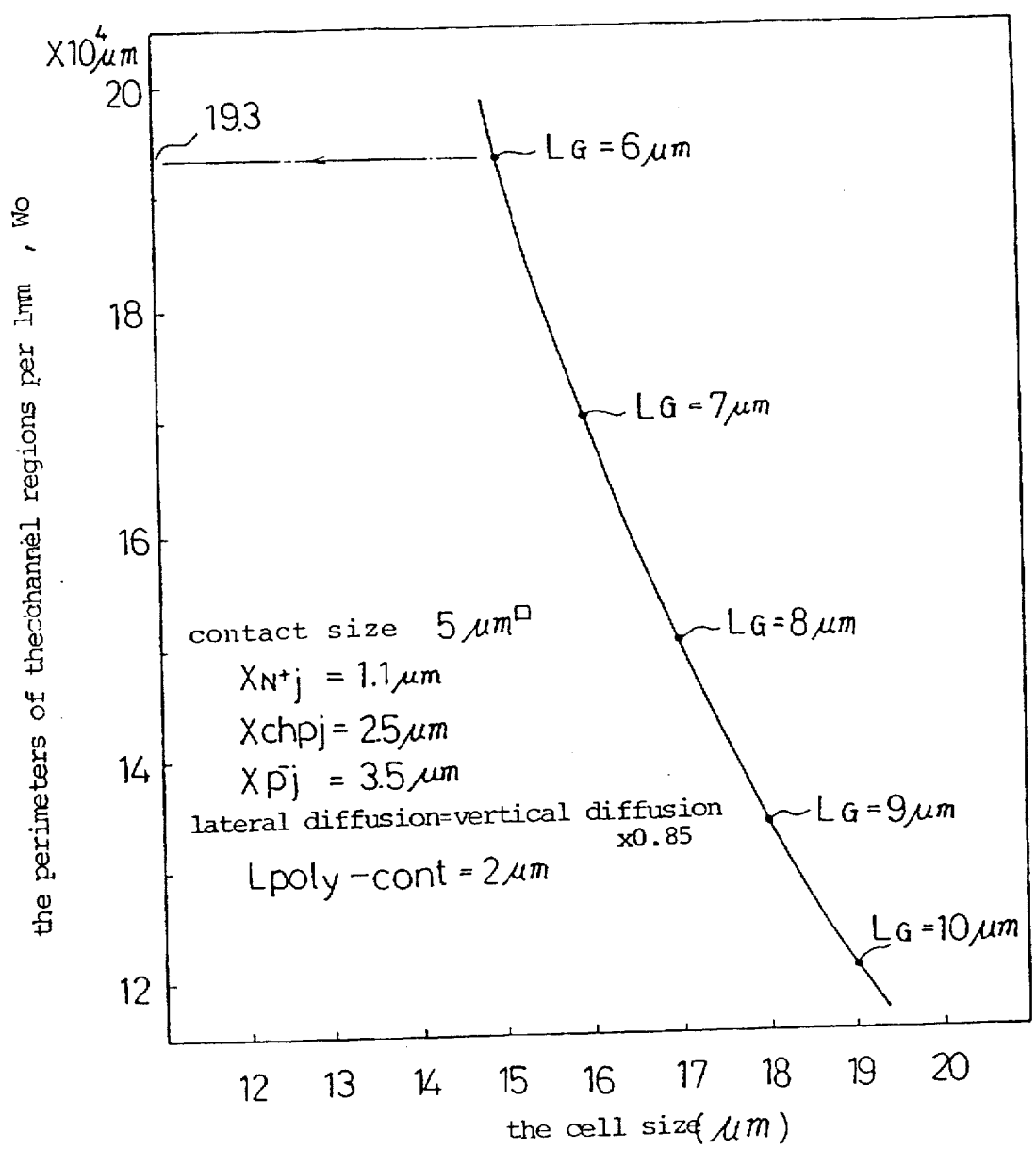
FIG. 24 and FIG. 25 are graphs showing the relationship between cell size and channel perimeter.

Based on the expression (9), the relationship between the cell-size $L_{cell}$ and the perimeter $W_o$ for 1 mm² when the mask member is not used is shown in FIG. 24.

When the mask member is used, representing the width of the mask member by Lm as shown in FIG. 22, we obtain $$4l=4·(L_{cell}-L_G-2L_m+2·0.85·X_{N+j}) \quad \ldots \quad (10)$$

Using the relationship $L_{cell}$=$L_G$+$L_{cont}$+2·$L_{poly-cont}$, assuming $L_m$=0.7 μm, and substituting values for other parameters used in the expression (9), we obtain $$W_o = 4l \quad (11)$$
$$= \frac{1 \times 1}{L_{cell}2 \times 10^{-6}} \times 4 \times (L_{cell} - L_G - 2·L_m + 2·0.85·X_{N+j})$$

and, as the perimeter $W_o$ for 1 mm², we obtain $$W_o = \frac{37.88}{(L_G+9)^2 \times 10^{-6}} \quad (12)$$

Figure 25:
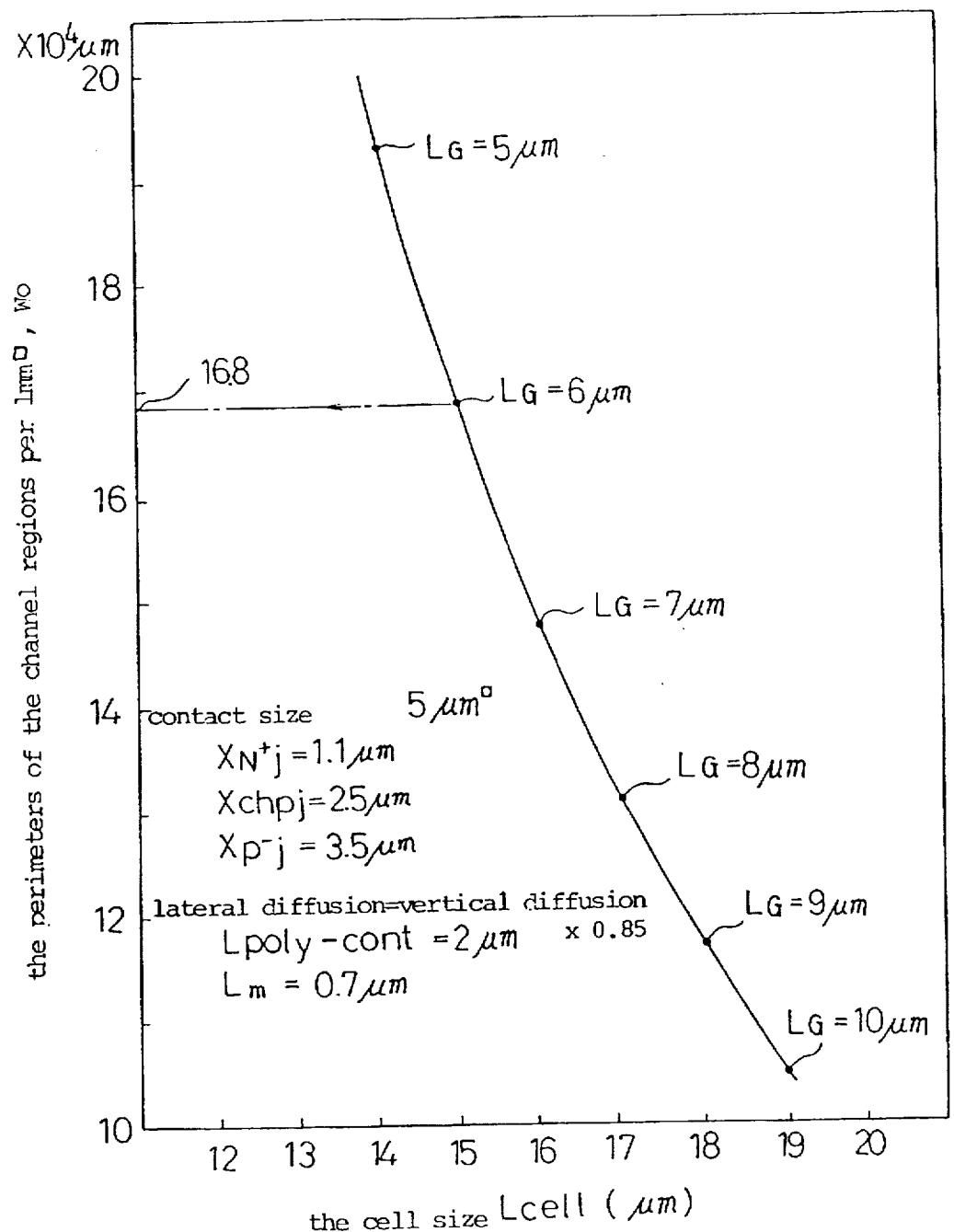

Expression (12) is shown in a graph of FIG. 25.

When $W_o$ in FIG. 24 and that in FIG. 25 are compared at $L_G$=6 μm, for example, while $W_o$ is 19.3×10⁴ μm-mm² when no mask member is used (FIG. 24), $W_o$ when the mask is used (FIG. 25) becomes 16.8×10⁴ μm-mm², i.e., 13% (=16.8/19.3) smaller. However, as shown in FIG. 23, while γ is 31 kΩ-μm when no mask member is used, γ when the mask member is used becomes 21.2 kΩ-μm. Therefore, it is advantageous to use the mask member.

More specifically, since $R_n$=γ/$W_o$ from the expression (6), $R_n$ when no mask is used becomes $$R_n = \frac{31}{19.3 \times 10^4} = 160 \, m\Omega \cdot mm^2,$$

whereas $R_n$ when the mask member is used becomes $$R_n = \frac{21.2}{16.8 \times 10^4} = 126 \, m\Omega \cdot mm^2,$$

and thus use of the mask member contributes to achievement of lowered ON resistance.

Figure 26:
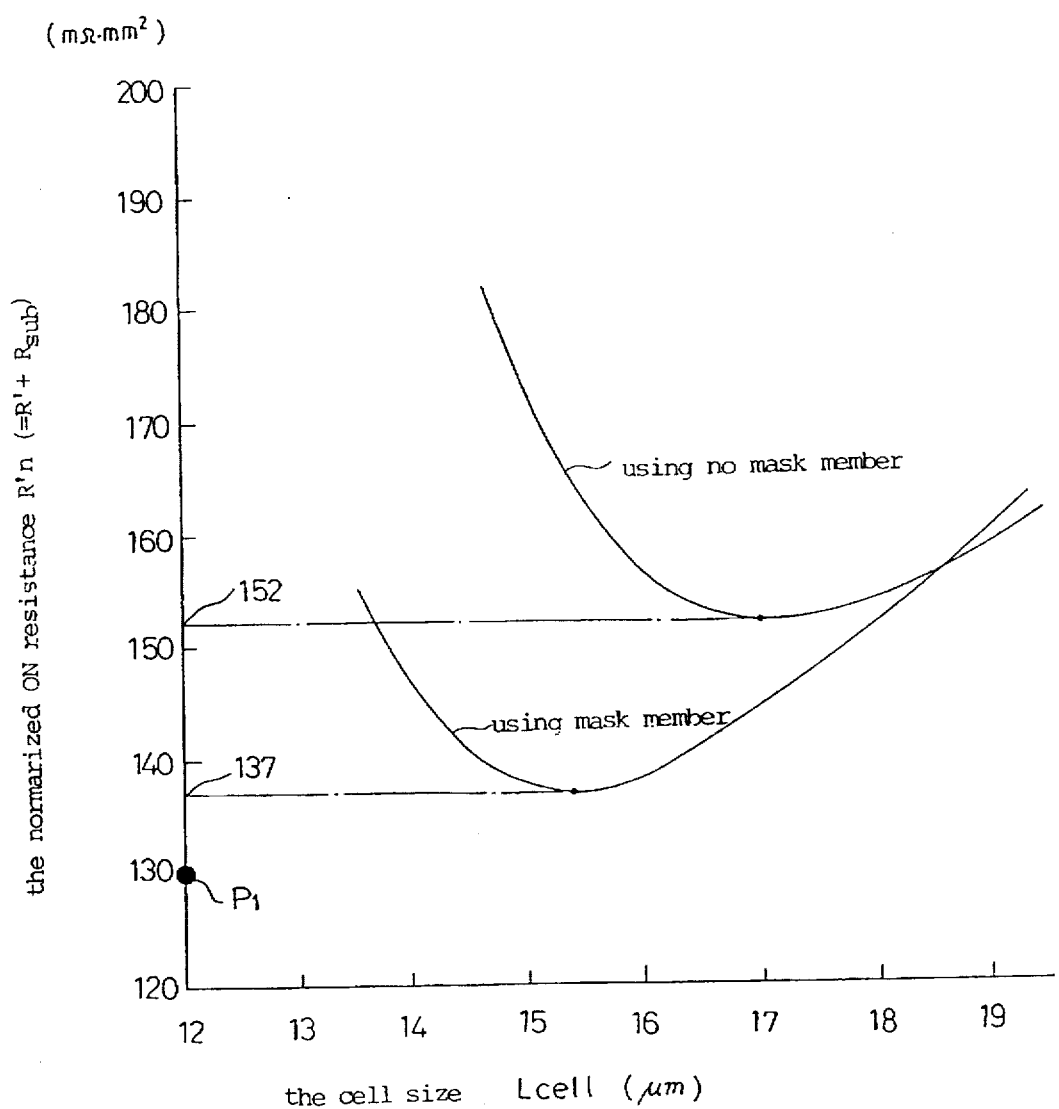
FIG. 26 is a graph showing the relationship between cell size and resistance.

Finally, results as shown in FIG. 26 are obtained. Referring to FIG. 26, the axis of ordinates represents $R_n'$ ($R_n+12$ $m\Omega \cdot mm^2$) when $R_{sub}=12$ $m\Omega \cdot mm^2$ and the axis of abscissas represents the cell size $L_{cell}$. Parameters are of the same values as shown in FIG. 23, FIG. 24, and FIG. 25. It is apparent from this graph that $R_n$, when mask members are used, can be reduced by 10% (=137/152) as compared with the case where no mask member is used, while reducing the cell size.

In the present embodiment as described above, double diffusion of impurities is performed with the polysilicon gate electrode member 11a and the mask members 16 disposed on both sides of the electrode member 11a used as the mask. Therefore, the distance between the edges of the P⁻ channel regions 17 (channel interval $L_1$) below the electrode member 11a can be made larger by the length corresponding to the mask members, without changing parameters such as the diffusion depth of the impurity. In other words, it becomes possible to reduce the cell size while maintaining a constant distance $L_1$ between the edges of the P⁻channel regions 17. Therefore, lowering of the ON resistance and miniaturization of the cell can be achieved while maintaining the transistor specifications (such as source-drain withstand voltage and sheet resistance of impurity regions).

[Second Embodiment]

Second embodiment will now be described. In the present embodiment, only points different from the first embodiment will be described. Other points are the same as in the first embodiment.

Figure 27:
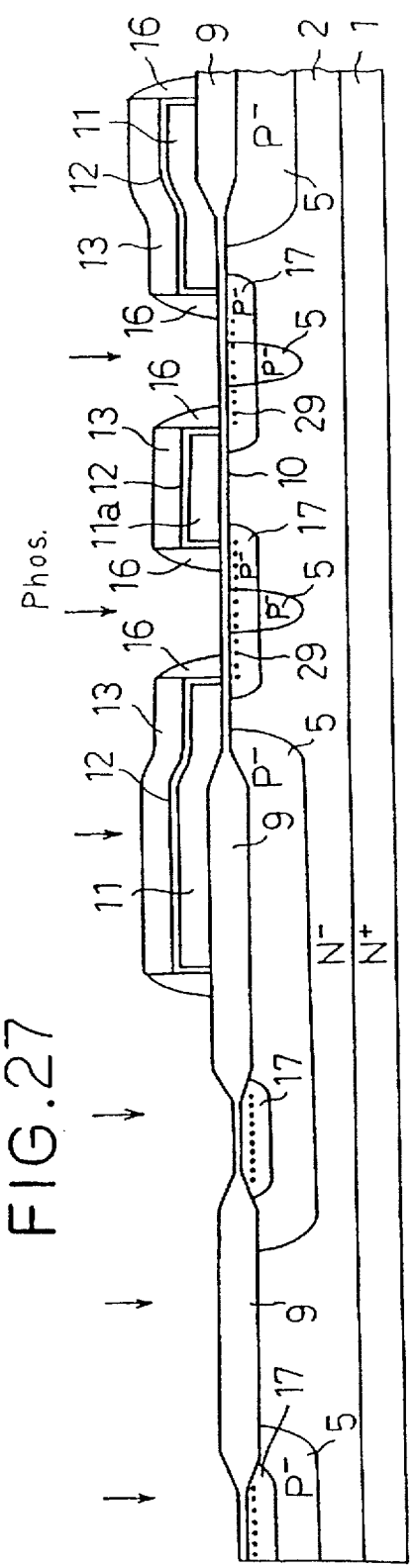
FIG. 27 to FIG. 29 are diagrams showing the production process of a semiconductor device of a second embodiment.
Figure 28:
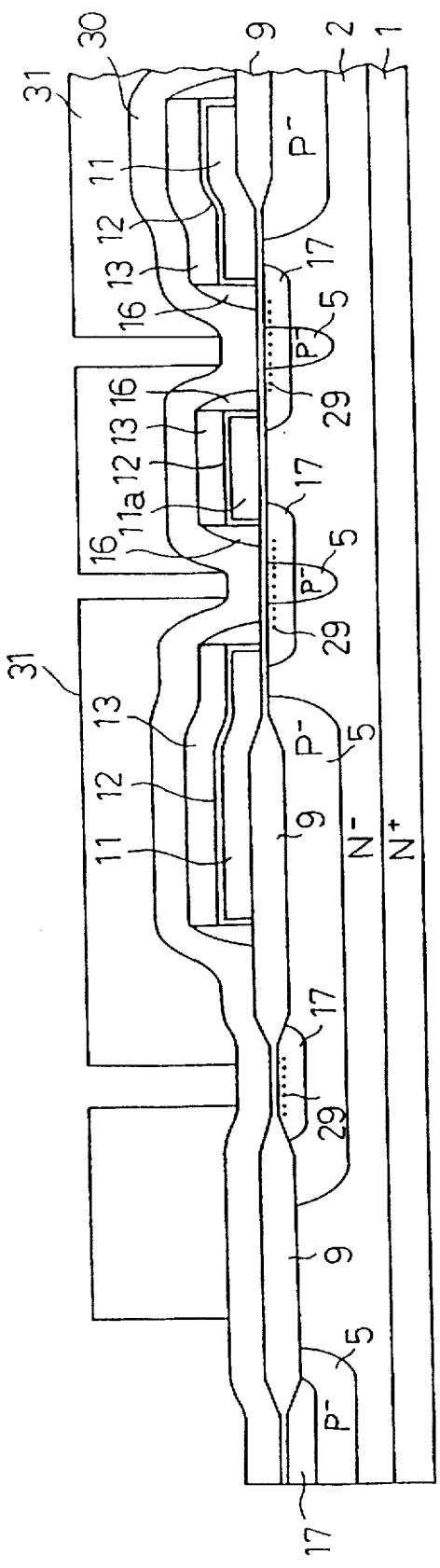
Figure 29:
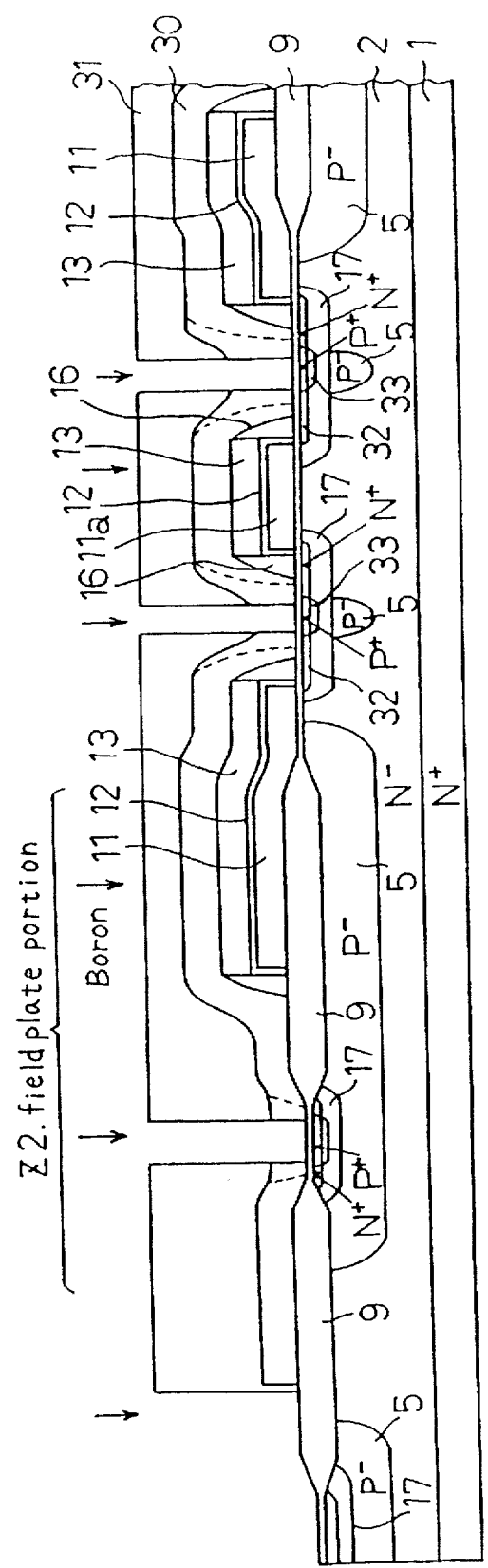

Following the state shown in FIG. 11 in the first embodiment, as shown in FIG. 27, phosphor ions for forming N⁺ source regions are implanted into the entire surface (maskless), whereby N⁺ implanted regions 29 are formed. Next, as shown in FIG. 28, a BPSG film 30 is formed on the entire surface. Thereafter, as shown in FIG. 29, photoetching for forming P⁺ body contacts is performed using a resist 31.

Then, boron ions are implanted into the N⁺ source region 32 to form a P⁺ contact region 33. In this ion implantation, a high dose is given which is sufficient to invert the N⁺ source region 32. $1\times10^{16}$ $cm^{-2}$ dose for example, at 60 keV. At this time, since the contact portion of the field plate portion Z2 is also inverted to P⁺ layer, the contact with the p⁻ channel region 17 can be obtained. Thereafter, with the resist 31 remaining attached to the product, wet etching is performed with HF or the like. As a result, the form as indicated by the broken lines in FIG. 29 is obtained by side etching. Therefore, it becomes possible to form a contact shorting the N⁺ source region 32 and the P⁺ contact region 33.

The process to be performed thereafter is the same as that shown in FIG. 15 and FIG. 1.

According to the present embodiment, as compared with the first embodiment, one photomask can be saved by using the resist 31 as both the mask member for making hole and the mask member for ion implantation.

|Third Embodiment|

Third embodiment will now be described. Also in the present embodiment, only points different from the first embodiment will be described. Other points are the same as in the first embodiment.

Although the CVD silicon oxide film 15 of TEOS was used as a film having a good step covering characteristic in the first embodiment, a low stress silicon nitride film 34 is used in the third embodiment as shown in FIG. 30. Thereafter, as shown in FIG. 31, the mask member 35 is formed of the silicon nitride film 34 by applying an etchback treatment thereto.

Figure 32:
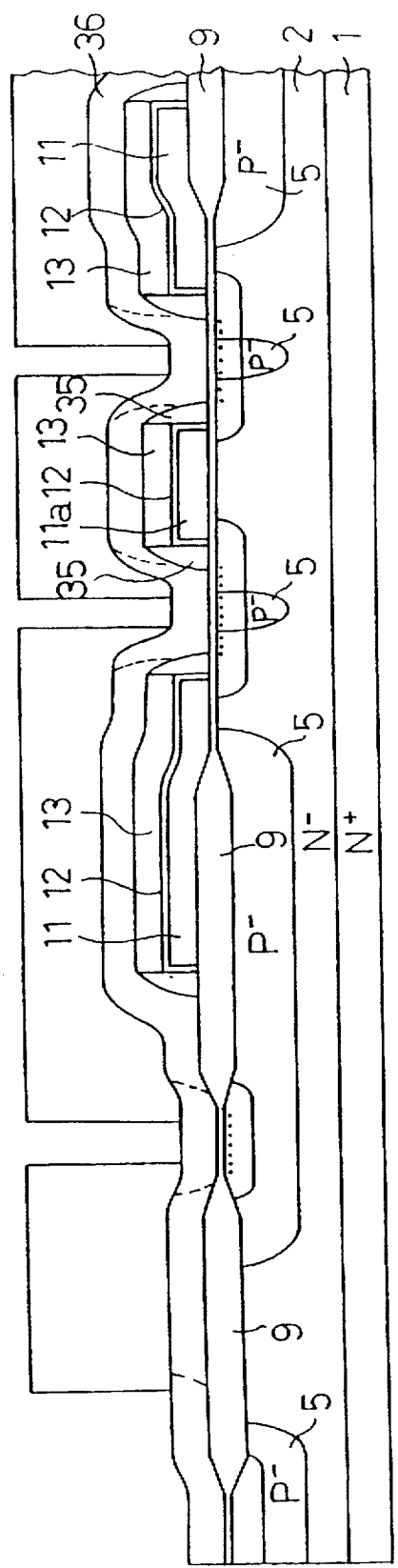

The mask member 16 had to be covered by the BPSG film in the first embodiment to secure insulation between the polysilicon gate electrode member 11a and the aluminum electrode 27 because the mask member 16 (the CVD silicon oxide film 15) and the BPSG film 23 are films of the same $SiO_2$ type and therefore exhibit virtually the same etch rate when subjected to wet etching with HF or the like. However, using the mask member 35 of the silicon nitride film 34 in the present embodiment, the etching rate by wet etching with HF or the like becomes very low. Therefore, even if the BPSG film 36 should get overetched during the etching for the contract as shown by broken lines in FIG. 32, the etching process would selectively stop at the mask member 35. Accordingly, reduction in the cell size $L_{cell}$ can be achieved.

More specifically, by reducing the distance $L_{poly-cont}$ to nil, a 12-µm cell as shown by the point P1 in FIG. 26 can be produced. Furthermore, as can be seen through comparison of the minimum values shown in the graph, the resistance $R_n$ can be reduced by 15% (=130/152).

(Fourth Embodiment)

In the vertical type semiconductor devices with the mask member of the first to third embodiments (described above), the distance of the lateral diffusion of the N⁺ source region which is present just below the gate electrode member can be shortened using the mask member. That is, the overlap distance between the gate electrode member and the N⁺ source region is decreased, and the capacitance between the source region and the gate electrode (input capacitance of DMOS) can be reduced to make it effective for high speed operations. In the fourth embodiment, when the depth of the N⁺ source region further increases and the lateral end of the source region intrudes just below the gate electrode member, the capacitance between the source region. The gate electrode can be reduced and the reduction of the withstand voltage which is due to the localized electric field to the gate insulation film at the end of the gate electrode member can therefore be prevented.

Figure 33:
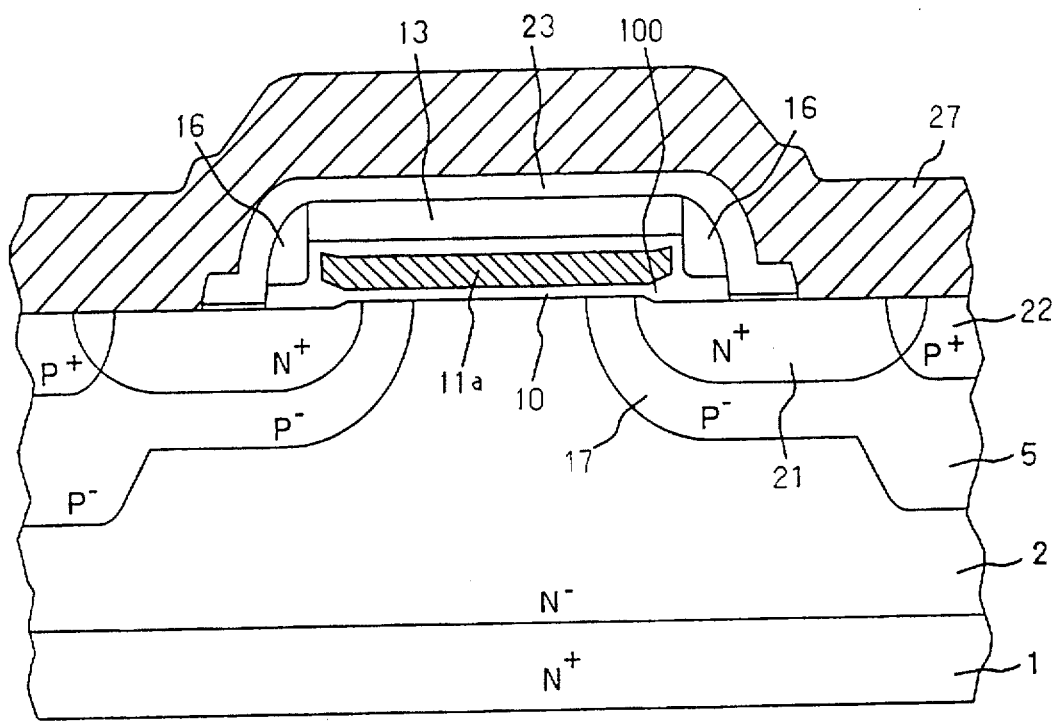
FIG. 33 is a sectional view of a semiconductor device according to a fourth embodiment.

FIG. 33 shows a sectional view of the vertical type semiconductor device of the fourth embodiment. FIG. 33 corresponds to a view for which a unit cell is shown in an enlarged scale in the vertical type DMOS transistor Z1 in FIG. 1. In this view, each of the cells has P⁻ channel regions 17 having a substantially square plane shape, over which are formed a gate electrode 11a substantially of a lattice pattern having substantially square opening and a mask member 16 for covering the side of the gate electrode 11a. The same constituents as those in the first embodiment carry the same reference numerals. Description will now be made for the production process of the device described above more in details with reference to FIG. 33 to FIG. 39.

Figure 34:
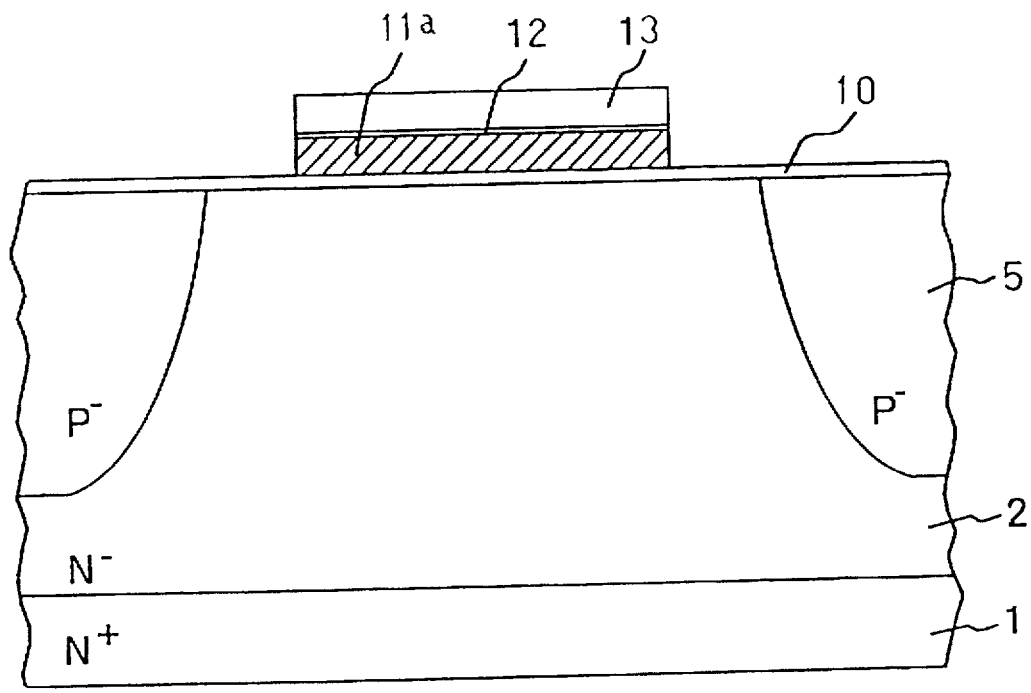
FIG. 34 to FIG. 39 are diagrams showing the production process of the semiconductor device according to the fourth embodiment.

At first, as shown in FIG. 34, an N⁺ silicon substrate 1 having a specific resistivity of less than 0.02 ohm·cm is prepared, on which an $N^-$ epitaxial layer 2 of $1\times10^{16}$ atom/cm$^3$ is formed to a thickness of 7 to 15 µm. Subsequently, a silicon oxide film as a mask (not illustrated) is formed to about 7000 angstrom on the $N^-$ epitaxial layer 2. Then, the silicon oxide film is photoetched for forming a deep $P^-$ well region 5 and boron ions are ion implanted. Then, drive-in is performed to form a deep $P^-$ well region 5.

Subsequently, the silicon oxide film is removed and then a thick silicon oxide film of about 9000 angstrom (not illustrated) is formed as a field oxide film to a necessary portion such as an electrode pad region. A gate insulation film 10 of about 600 angstrom is then formed by thermal oxidation process.

Subsequently, a polysilicon film deposited to about 5000 to 10000 angstrom by LPCVD and applied with phosphor diffusion is formed and the surface is thermally oxidized to form a thin polysilicon oxide film 12, on which a silicon oxide film 13 of about 1 Rm thickness is deposited by CVD, and the polysilicon film and the silicon oxide film are photoetched to form a gate electrode member 11a and a silicon oxide film 13 covering electrode member 11a.

Figure 35:
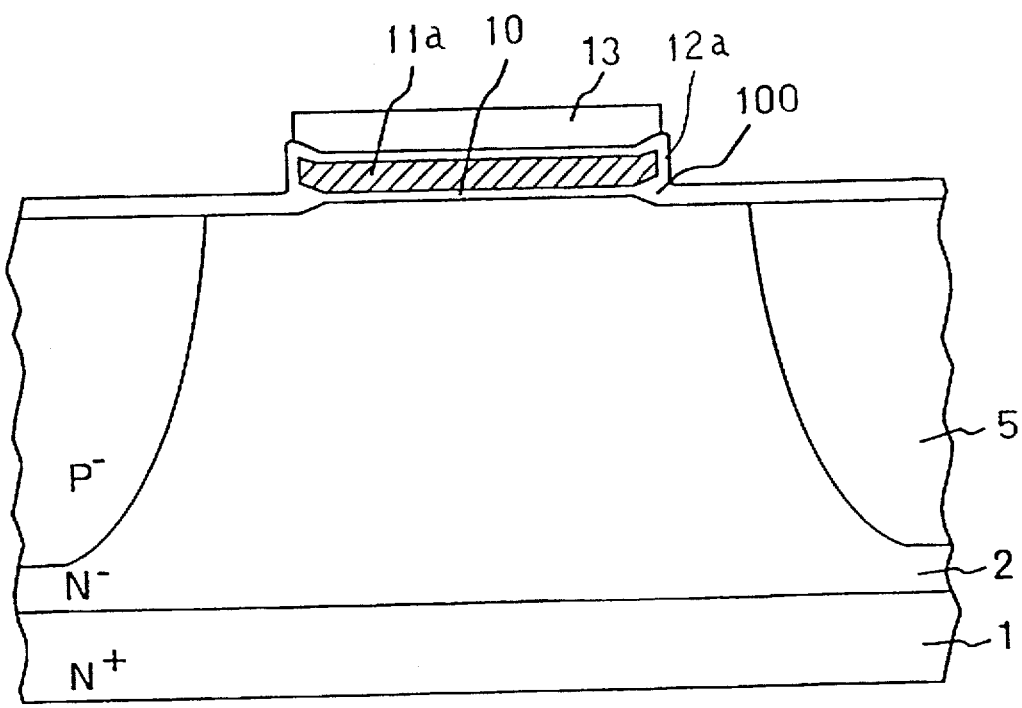

Then, as shown in FIG. 35, the thickness of the exposed gate insulation film 10 is increased by thermal the upper surface of the gate oxidation, and the silicon oxide film 12a is formed on the side of the gate electrode member 11a. At this time, the gate insulation film 10 just below the end of the gate electrode member 11a is thickened to form a thickened gate insulation portion 100 of a bird's beak shape. The thermal oxidation is performed by wet oxidation at about 900° C.

Figure 36:
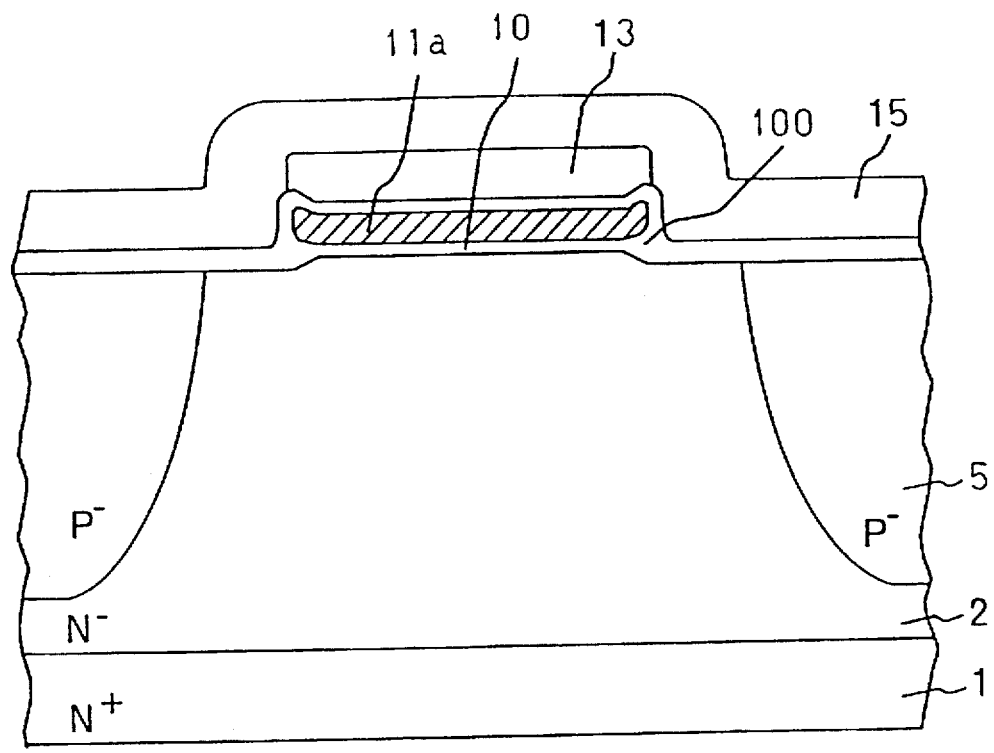

Then, as shown in FIG. 36, a CVD silicon oxide film 15 of a satisfactory step coverage is formed to about 1 µm over the entire surface.

Figure 37:
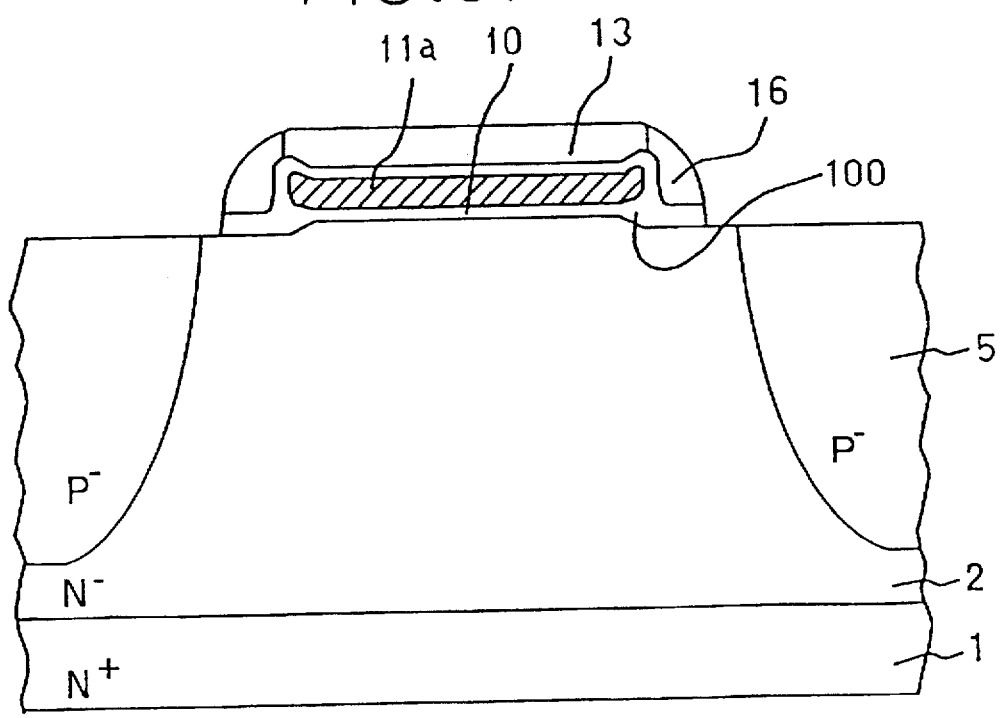

Subsequently, as shown in FIG. 37, the CVD silicon oxide film 15 is anisotropically etched by reactive ion etching (RIE) to form a mask member 16 with the CVD silicon oxide film 15 on the side of the gate electrode member 11a.

Subsequently, a thin silicon oxide film 101 is formed on the surface of an exposed $N^-$ epitaxial layer 2, boron ions are implanted through the silicon oxide film 101 and, further, drive-in is performed to form a shallow $P^-$ channel region 17 at the surface of the epitaxial layer 2.

Figure 38:
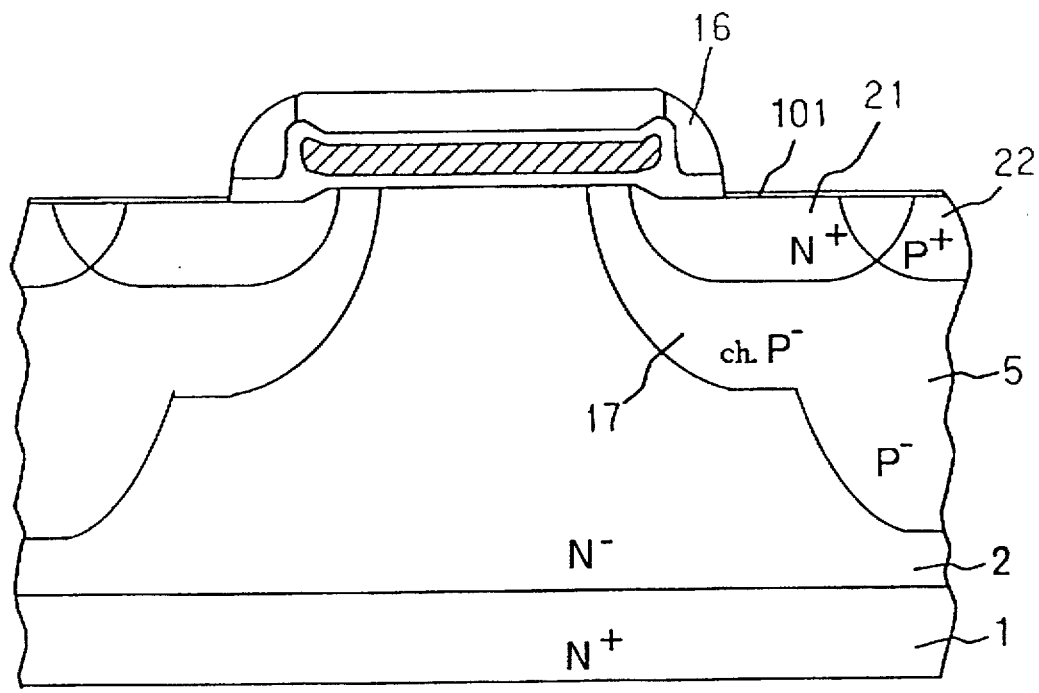

Subsequently, as shown in FIG. 38, phosphorus ions are implanted into the surface of the $P^-$ channel region 17 by using a mask patterned by lithography, and thereby an $N^+$ source region 21 is formed at the surface of the $P^-$ channel region 17. Then, after removing the mask, a $P^+$ contact region 22 for well contact is formed in the central portion at the surface of the channel region 17 by means of ion implantation of boron. Then, annealing is performed in an N2 atmosphere to activate the $N^+$ source region 21 and the $P^+$ contact region 22. When annealing is performed at 1000 to 1050° C. for about one hour, doped atoms in the $N^+$ source region 21 region 22 are driven-in to about 0.7 to 1.2 µm. The end of the $N^+$ region 21 on the side of the gate electrode is defined by the position at the end of the mask member 16 irrespective of the shape of the photoresist mask and, as a result, the DMOS channel distance below the gate electrode member is determined by a difference in the lateral diffusion between the double ion implantation as described above.

Figure 39:
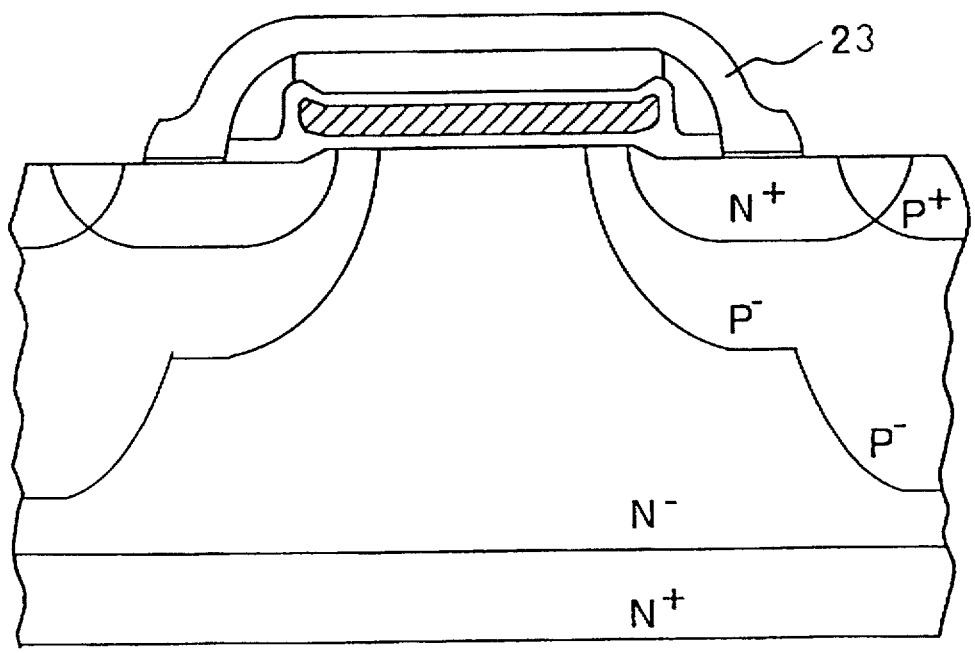

Then, as shown in FIG. 39, an interlayer insulation film 23 comprising a BPSG film is deposited over the entire surface by CVD, and a predetermined region of the interlayer insulation film 23 is removed by photolithographic steps, to form an opening for contact. Then, as shown in FIG. 33, a source electrode 27 and a gate pad portion (not illustrated)

made of aluminum are formed. Further, a drain electrode (not illustrated) is formed at the back face of a substrate 1. Thus, a semiconductor device having a vertical type DMOS power transistor is completed.

Figure 40:
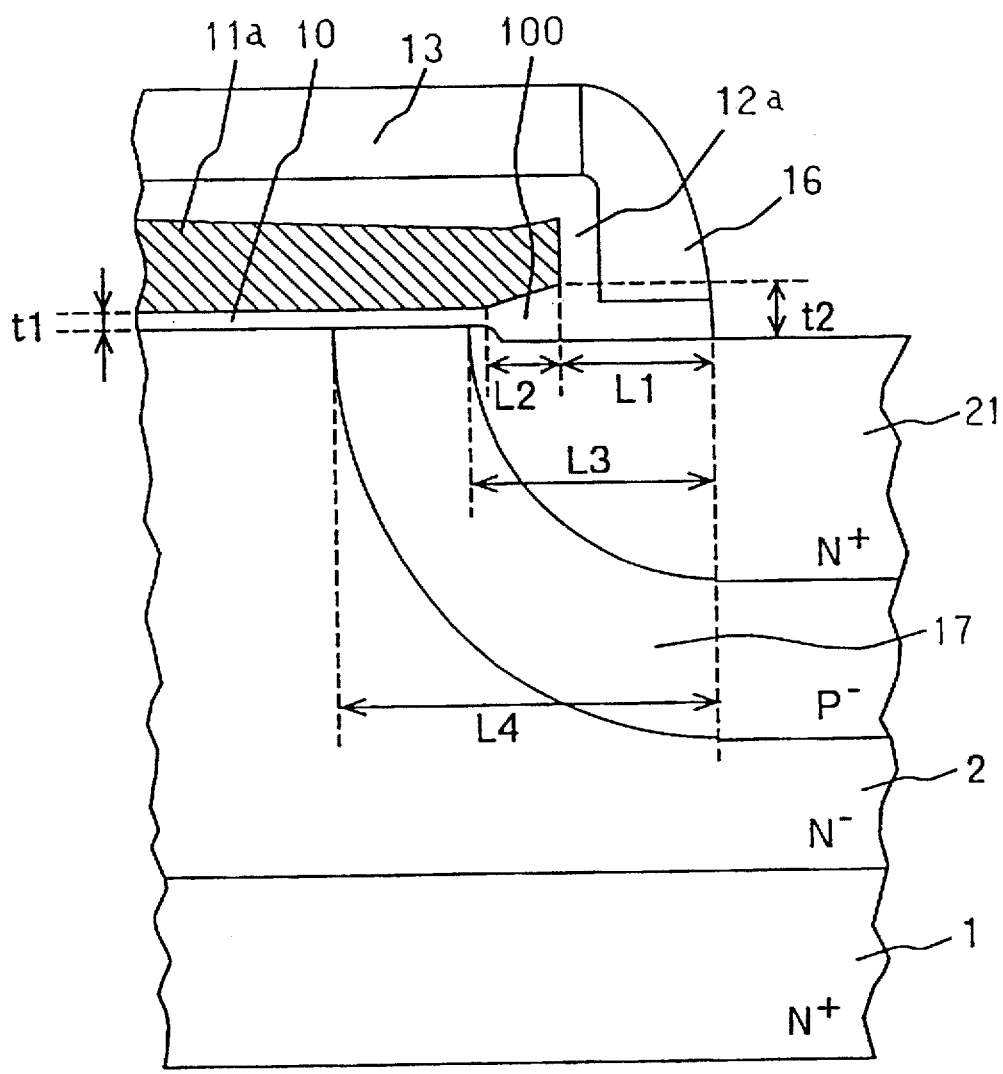
FIG. 40 is an enlarged fragmentary sectional view at the end of a gate electrode of the semiconductor device showing FIG. 33.

Description will next be made for the dimensional relationship in each of the portions with reference to FIG. 40 which is an enlarged sectional view for the end of the gate electrode of the vertical type DMOS power transistor.

The width L1 at the lowermost portion of the mask member 16 (also including the silicon oxide film 12a on the side of the gate electrode member 11a) is determined by the thickness of the laminated films comprising the gate electrode member 11a and the silicon oxide film 13 thereover, that is, by the height from the surface of the epitaxial layer 2 to the upper surface of the silicon oxide film 13 after etching back. The width is defined here as about 0.5 µm. L2 represents a lateral distance of the thickened portion 100 of the gate insulation film 10, L3 represents the distance of the lateral diffusion of the $N^+$ source region 21 and L4 represents the distance of the lateral diffusion of the $P^-$ channel region 17. As can be seen from FIG. 40, it is preferred that L3 is greater than L2+L1. L4–L3 defines the channel distance.

A symbol t2 represents a maximum thickness of the thickened gate insulation portion 100, which is defined as 0.2 µm herein. A symbol t1 represents the thickness of the gate insulation film 10.

Description will now be made to the feature of the fourth embodiment.

In the vertical type DMOS power transistor, since the lateral diffusion of double diffused impurity ions starts from the outer end of the mask member 16, the lateral dimension of the DMOS cell is shortened by so much as the reduction for the lateral extension of the $N^+$ source region 21 and, the degree of integration of the DMOS cell is increased by so much, and the ON resistance can be reduced compared to when the lateral diffusion is started from the end of the gate electrode as in the prior art, assuming the various conditions to be identical.

Further, the distance from the end at the contact surface between the aluminum electrode 27 and the $N^+$ source region 21 to the boundary between the $N^+$ source region 21 and the $P^-$ channel well region 17 can also be shortened. The resistance can therefore be reduced by so much as the shortening for the distance of the $N^+$ source region 21. Since the lateral width of the $N^-$ epitaxial layer just below the gate electrode member 11a and, accordingly, the lateral width of the vertical channel portion formed therein are increased by so much as the reduction of the distance of the $N^+$ source region 21, the resistance loss in that portion, namely, the JFET resistance can be reduced.

Further, the gate/source capacitance which has been difficult to reduce structurally can be decreased. That is, the overlap distance between the gate electrode member 11a and the source region 21 is decreased by so much as the lateral width of the bottom of the mask member 16 and the gate/source capacitance. The input capacitance of the device can be reduced accordingly to attain high speed driving.

Figure 41:
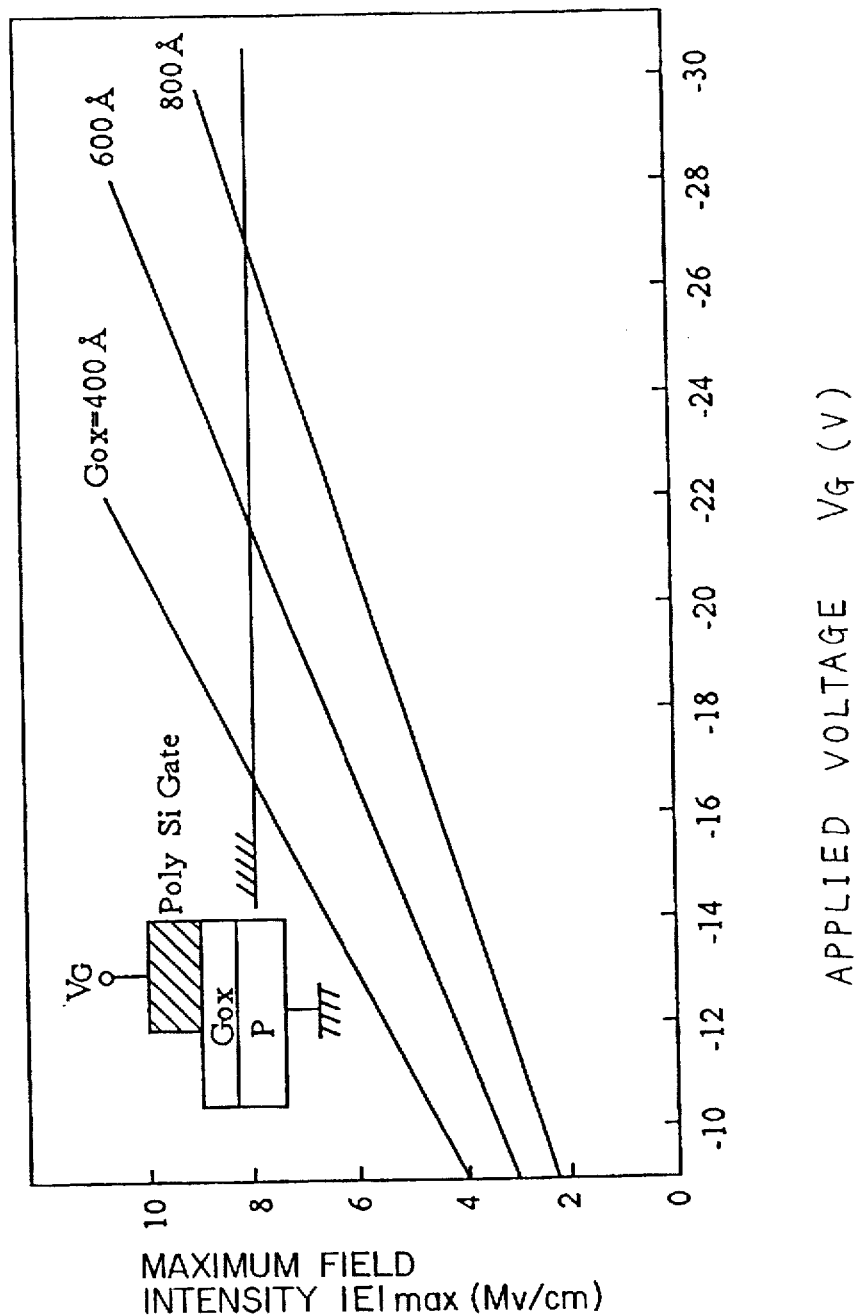
FIG. 41 is a graph showing the result of simulation for the electric field intensity at the end of the gate electrode.

Then, in this fourth embodiment, the electric field in the gate insulation film is relaxed by so much as the increase of the thickness of the gate insulation film 10 interposed between the gate electrode 11a and the source region 21 by the thickened portion 100, and the gate withstand voltage is improved. FIG. 41 illustrates a result of simulation for the localized electric field at the end of the gate electrode in a case of disposing the gate electrode to the surface of the $P^-$ substrate interposing the gate insulation film therebetween. It can be seen that if the gate insulation film is thick, the electric field is relaxed and the withstand voltage can be improved. That is, in the fourth embodiment, since the thickness of the gate insulation film 10 is increased at the end of the gate electrode member, the vertical distance between the source region 21 intruding just below the gate electrode member 11a and the gate electrode member 11a thereabove is increased. Thus the capacitance between the source region and the gate electrode can be reduced and, in addition, destruction of the gate insulation film 10 by the localized electric field at the end of the gate electrode member 11a can be prevented.

Further, since the increase for the thickness of the gate insulation film 10 is performed in a bird's beak shape by the oxidation for the surface of the substrate after forming the gate electrode, there is no step formed to the boundary between the thickened portion 100 of the gate insulation film and other portion, and the increase of the thickness can be attained also by a simple process.

(Fifth Embodiment)

In the power semiconductor device of this kind, it has been known to integrate semiconductor devices such as diodes on the field insulation film for the protection of the device. For instance, Japanese Patent Laid-Open Sho 62-229866 discloses forming a polysilicon region on a field insulation film and forming a junction diode for temperature detection in the polysilicon region. Further, Japanese Patent Laid-Open Hei 2-288366 discloses forming a polysilicon region on a field insulation film and forming a zenor diode for high voltage protection in the polysilicon region.

Generally, the diodes are usually formed by depositing a polysilicon film on a field oxide film, photoetching the polysilicon film to form a polysilicon region of a predetermined shape, usually forming a thin oxide film for the protection of the surface and, applying doping for the formation of junction to the polysilicon region in the subsequent step. The steps as far as the formation of the above-described polysilicon region are usually performed before the formation of the gate insulation film and the gate electrode for the vertical type DMOS transistor to reduce the damages to surface of the substrate and shorten the steps. Subsequently, steps may be added. For instance, applying a purifying treatment to the surface of the substrate in the DMOS transistor portion by thermal oxidation, etching the oxide film etching, and then going to the gate electrode forming step.

However, when integrating the diodes, etc. to the device adopting the mask member according to the present invention, if RIE is performed for forming the mask member after forming the gate electrode, the polysilicon region may be etched back or the surface thereof is roughened by RIE. Although it may be possible to form a thick protection pattern also on the polysilicon forming, patterning and region, it requires steps for removing them, as well as it brings about a pollution problem by such steps.

Figure 42:
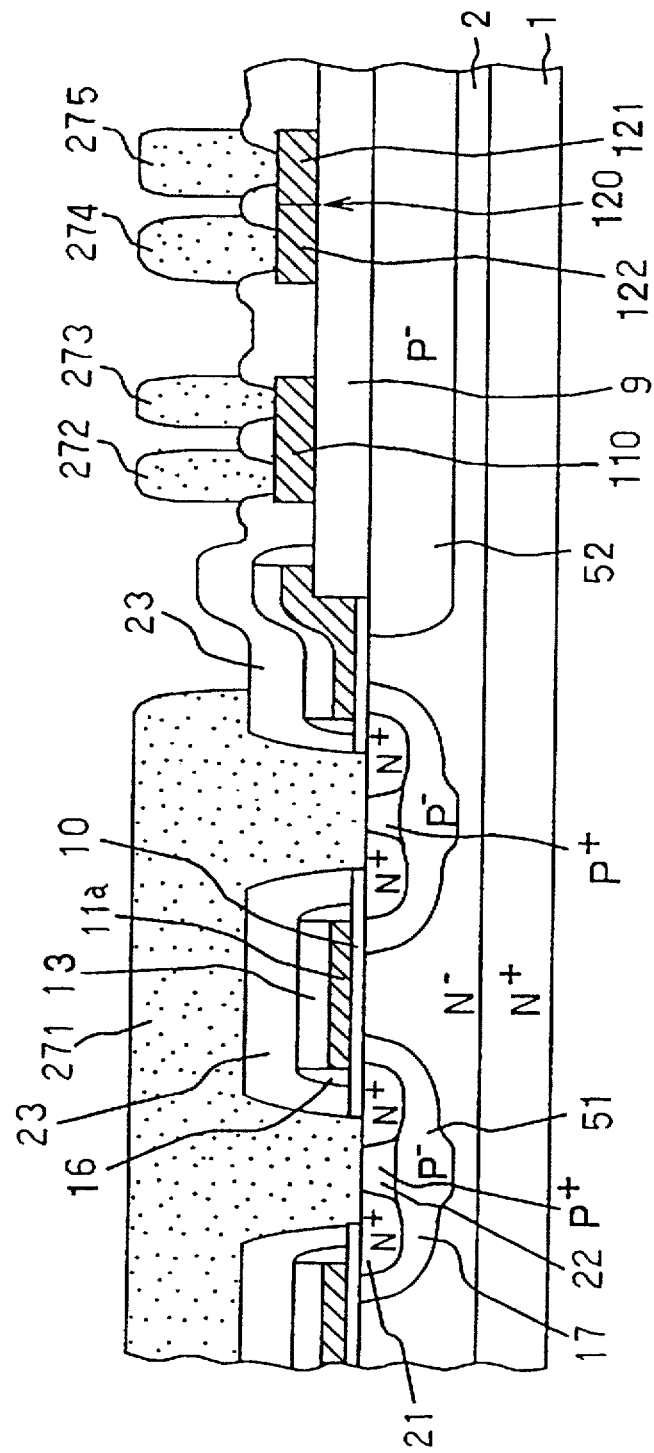
FIG. 42 is a sectional view of a semiconductor device according to a fifth embodiment.

According to the fifth embodiment, the above-mentioned problems can be overcome. FIG. 42 is a fragmentary sectional view of the semiconductor device produced according to the fifth embodiment, which shows a vertical type DMOS transistor and a protection device region. The same constituents as those in the first embodiment carry the same reference numerals. In FIG. 42, 51 denotes a deep P– well region, 52 denotes a P-shield well region, 271 to 275 denote electrodes made of aluminum, 110 denotes a resistor made of polysilicon and 120 a zenor diode comprising polysilicon.

Description will now be made including more in details concerning the above with production process of the device as described reference to FIG. 42 to FIG. 46.

Figure 43:
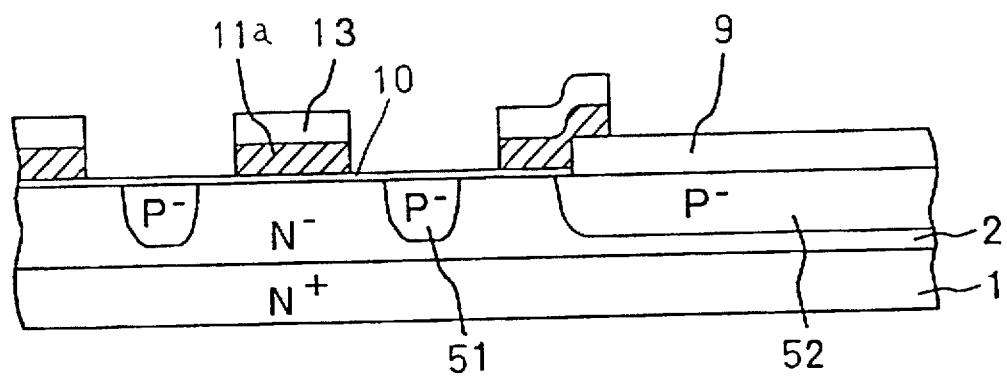
FIG. 43 to FIG. 46 are diagrams showing the production process of the semiconductor device according to the fifth embodiment.

At first, as shown in FIG. 43, an N+ silicon substrate 1 of specific resistivity of less than 0.02 ohm·cm is prepared, on which an N– epitaxial layer 2 of $1 \times 10^{16}$ atom/cm$^3$ is formed to a thickness of 7 to 15 µm. Subsequently, a silicon oxide film as a mask (not illustrated) is formed to about 7000 angstrom on the N– epitaxial layer 2. Then, the silicon oxide film is photoetched for forming deep P– well regions 51, 52 and boron ions are implantated under the condition of $3-5 \times 10^{13}$ dose/cm$^2$ and at 60 keV. Subsequently, drive-in (at 1170° C. for 4–5 hours, in $N_2$) is performed to form deep P– well regions 51, 51.

Subsequently, the silicon oxide film is removed, then a thick silicon oxide film (field oxide film) 9 of about 9000 angstrom is selectively formed on the P-shield well region 52 for relaxing the electric field by means of LOCOS oxidation or the like. The gate insulation film 10 of about 300 to 1000 angstrom is then formed by a thermal oxidation process.

Then, a polysilicon film deposited to about 3000 to 5000 angstrom by LPCVD and applied with phosphor diffusion is formed, the surface is oxidized to form a thin silicon oxide film (not illustrated). A silicon oxide film of about 1 µm thickness is deposited thereon by CVD, and the polysilicon film and the silicon oxide film are photoetched to form a gate electrode member 11a and a silicon oxide film 13 covering the upper surface of the gate electrode member 11a (refer to FIG. 13). Further, a thin silicon oxide film (not illustrated) is formed on the side of the gate electrode 11a.

Figure 44:
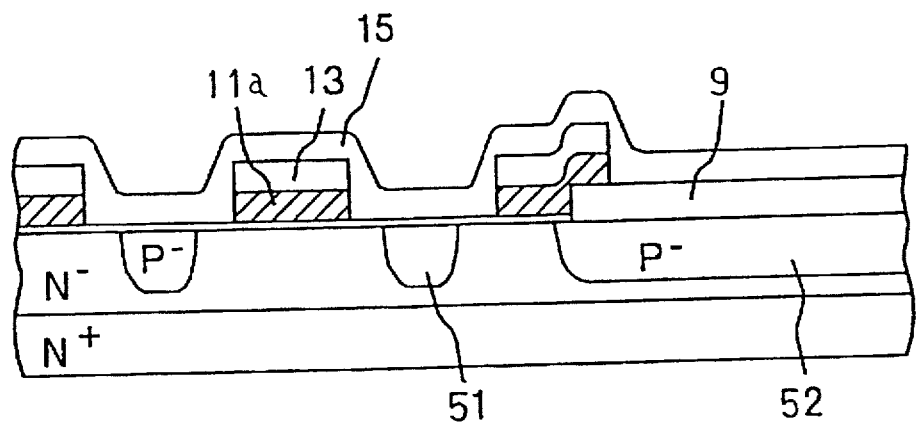

Subsequently, as shown in FIG. 44, a CVD silicon oxide film 15 of TEOS having a good step coverage is formed over the entire surface to about 1 µm.

Figure 45:
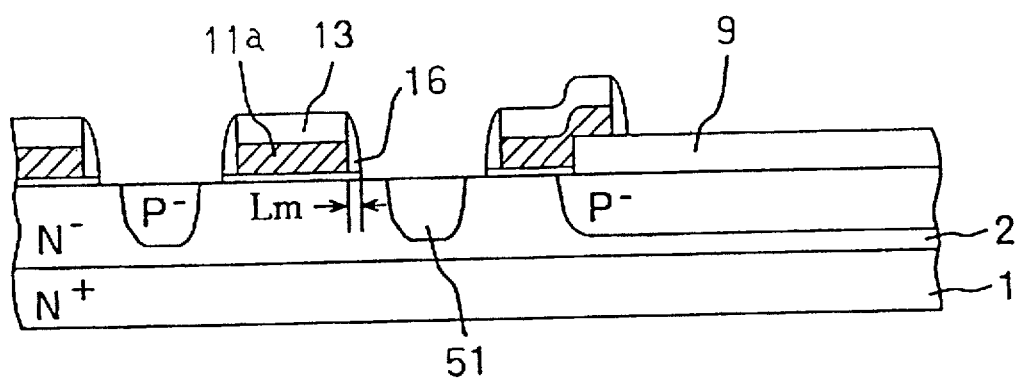

Subsequently, as shown in FIG. 45, the CVD silicon oxide film 15 is etched back by reactive ion etching to form a mask member 16 (see FIG. 45) with a CVD silicon oxide film 15 on the side of the gate electrode member 11a. The width µm at the lowermost portion of the mask member 16 is determined by the lamination thickness of the gate electrode member 11a and the silicon oxide film 13 thereon. That is, the height from the surface of the epitaxial layer 2 to the upper surface of the silicon oxide film 13 after etching back and the TEOS film thickness before etching back.

Figure 46:
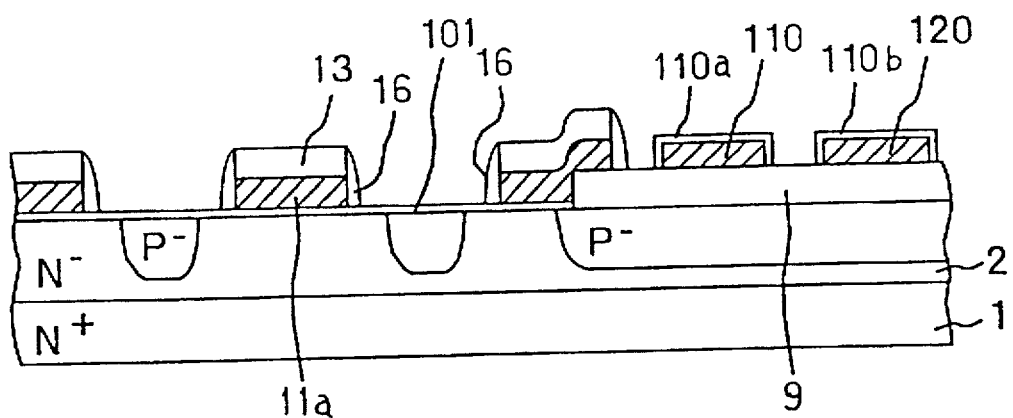

Subsequently, as shown in FIG. 46, a thin silicon oxide film 101 is formed by oxidation to the surface of an exposed epitaxial layer 2, a polysilicon layer at a low concentration is formed to a thickness of about 3000 to 5000 angstrom over the entire surface of a wafer, and the polysilicon film is photoetched to form polysilicon regions as a polysilicon resistor 110 and a zenor diode 120 on the field insulation film 9. Then, the surfaces of the polysilicon regions are thermally oxidized to form thin silicon oxide films 110a, 110b.

Subsequently, as shown in FIG. 42, boron ions are implanted through the silicon oxide films 101, 110a, 110b under the condition of $6 \times 10^{13}$ to $9 \times 10^{13}$ dose/cm$^2$ at 40 keV and, further, drive-in is performed at 1170° C. for about 100 min to form a shallow P– channel well region 17 at the surface of the epitaxial layer 2.

Next, phosphorus ions are implanted into the surface of the P– channel region 17 and a right half of the polysilicon region 120 using a photoresist mask patterned by photolithography under the condition of $3-5 \times 10^{15}$ dose/cm$^2$ and at 100 keV, to form an N+ source region 21 on the surface of the P– channel well region 17, and also to form an N+ polysilicon region 121. Then, the photoresist mask is removed and boron ions are implanted under the condition of 5–7×10¹⁴ dose/cm² and at 40 keV to form a P+ contact region 22 for well contact in the central portion on the surface of the channel well region 17, to form the polysilicon region 110 as a P+ resistance line and form a P+ polysilicon region 122 in the left half of the polysilicon region 120. Thus, the polysilicon region 120 is formed as a polycrystalline zenor diode.

Subsequently, annealing is performed in an N2 atmosphere to activate the N+ source region 21, the P+ contact region 22 and the polysilicon regions 110, 120. The end of the N+ source region 21 on the side of the gate electrode is defined by the position at the end of the mask member 16 irrespective of the shape of the photoresist mask. A result, the channel distance of DMOS below the gate electrode member 11a is determined by the difference of the lateral extension between twice processes of ion implantation.

Subsequently, an interlayer insulation film 23, for example, made of BPSG is deposited by CVD over the entire surface and then a predetermined region of the interlayer insulation film 23 is removed by photholithographic steps, to form an opening for contact. Then, electrode portions 271 to 275 made of aluminum are formed. Further, a drain region (not illustrated) of the vertical DMOS transistor is formed also to the back face of the substrate 1. Thus, a semiconductor device having a plurality of vertical type DMOS power transistors, as well as the P+ polysilicon resistor 110 and the zenor diode 120 on the field insulation film 9 is completed.

Description will now be made to the feature of the fifth embodiment.

As has been explained for various embodiments described above, the lateral size of the DMOS cell can be shortened by double diffusion with addition of the mask member 16 and the integration degree of DMOS can be increased and the ON resistance can be reduced by so much. Further, in this instance, reduction of the distance between the adjacent DMOS cells just below the gate electrode member 11a can be suppressed, and the increase of the JFET resistance loss in this portion can be prevented. Further, reduction of the gate-source capacitance, which has been difficult so far structurally, can be reduced. That is, the overlapping distance between the gate electrode member 11a and the source region 21 is decreased by so much as the lateral width Lm of the mask member 16, and the gate/source capacitance. Namely, the input capacitance of the device can be decreased so that the DMOS can be driven at a high speed with a device having a small current driving performance.

Further, in this embodiment, since the polysilicon regions 110, 120 are formed after RIE, the polysilicon regions 110, 120 are not damaged by etching back in RIE.

In this embodiment, although the ion implantation step to the polysilicon regions 110 and 120 is used in common with the ion implantation step to the vertical type DMOS transistor portion, it will be apparent that they can be performed independently of each other. Further, it is also possible to add a recrystallization step such as laser annealing to the polysilicon regions 110, 120 or form MOS transistor to the polysilicon regions 110, 120.

The present invention is not limited to the above described embodiments but is applicable, for example, to P channel MOS transistors, and not only to MOS transistors but also to IGBTs, SITs, SI thyristors, etc. The formation of the mask member in the above described embodiments was performed by forming the silicon oxide film 15 on the entire surface of the substrate and then applying an etchback treatment to the film. However, it may be practicable to first deposit a silicon oxide film 15 to the entire surface of the substrate including the electrode members and then apply a photoetching treatment to the film using a resist so that a specified width of the film is left deposited on the side of the electrode members.

What is claimed is:

1. A vertical semiconductor device comprising:
   a semiconductor substrate of a first conductivity type;
   a gate electrode having sides and being formed above a surface of said semiconductor substrate, said gate electrode having a thick central portion and a thin edge portion;
   a gate insulation film positioned between said gate electrode and said semiconductor substrate;
   an insulating mask member for covering each side of said gate electrode;
   a channel well region of a second conductivity type formed on said surface of said substrate, a lateral diffusion edge of said channel well region reaching and terminating at a position below said gate electrode; and
   a source region of said first conductivity type formed shallower than said channel well region on a surface of said channel well region, a lateral diffusion edge of said source region reaching and terminating at a position below said gate electrode,
   wherein said gate insulation film has a thick portion located below a side edge portion of said gate electrode where said source region and said gate electrode overlap each other, and a thin portion located on said channel well region where an inversion layer is formed, said thick portion of said gate insulation film being thermally oxidized polysilicon from said gate electrode and having an inclined portion most proximate to said thin portion; and
   said side edge portion of said gate electrode is disposed over said inclined portion of said gate insulation film.

2. A vertical semiconductor device as defined in claim 1, wherein said lateral diffusion edge of said source region is substantially aligned with a connection between said thick portion of said gate insulation film and said thin portion of said gate insulation film.

3. A vertical semiconductor device as defined in claim 2, wherein said lateral diffusion edge of said source region is slightly shifted from said connection between said thick portion of said gate insulation film and said thin portion of said gate insulation film and located below said thin portion of said gate insulation film.

4. A vertical semiconductor device as defined in claim 1, wherein edges of said insulating mask member and edges of said thick portion of said gate insulating film are respectively aligned.

5. A vertical semiconductor device as defined in claim 4, wherein said lateral diffusion edge of said source region is slightly shifted from a connection between said thick portion of said gate insulation film and said thin portion of said gate insulation film and located below said thin portion of said gate insulation film.

6. A vertical type semiconductor device comprising:
   a semiconductor substrate of a first conductivity type;
   a gate electrode having sides and being disposed above a surface of said semiconductor substrate, said gate electrode having a thick central portion and a thin edge portion;
   a gate insulation film positioned between said gate electrode and said semiconductor substrate;

a channel well region of a second conductivity type disposed on said surface of said substrate, a lateral diffusion edge of said channel well region reaching and terminating at a position below said gate electrode;

a source region of said first conductivity type also disposed on said surface of said substrate adjacent to said channel well region, a lateral diffusion edge of said source region reaching and terminating at a position below said gate electrode, wherein said gate insulation film has a thick portion located below a side edge portion of said gate electrode located where said source region and said gate electrode overlap each other, and a thin portion located on said channel well region where an inversion layer is formed, said thick portion of said gate insulation film being thermally oxidized polysilicon from said gate electrode and having an inclined portion most proximate to said thin portion; and said side edge portion of said gate electrode is disposed over said inclined portion of said gate insulation film.

7. A vertical semiconductor device as defined in claim 6, further comprising an insulating mask member covering each side of said gate electrode, wherein said lateral diffusion edge of said source region is substantially aligned with a point of intersection between said thick portion of said gate insulation film and said thin portion of said gate insulation film.

8. A vertical semiconductor device as defined in claim 7, wherein said lateral diffusion edge of said source region is slightly shifted from said connection between said thick portion of said gate insulation film and said thin portion of said gate insulation film, said lateral diffusion edge of said source region being located below said thin portion of said gate insulation film.

9. A vertical semiconductor device as defined in claim 6, further comprising an insulating mask member covering each side of said gate electrode, wherein an edge of said insulating mask member and an edge of said thick portion of said gate insulating film are aligned.

10. A vertical semiconductor device as defined in claim 9, wherein said lateral diffusion edge of said source region is slightly shifted from a point of intersection between said thick portion of said gate insulation film and said thin portion of said gate insulation film, said lateral diffusion edge of said source region being located below said thin portion of said gate insulation film.

* * * * *

UNITED STATES PATENT AND TRADEMARK OFFICE
CERTIFICATE OF CORRECTION

PATENT NO. : 5,798,550
DATED : August 25, 1998
INVENTOR(S) : Okabe (Kuroyanagi), et al It is certified that error appears in the above-identified patent and that said Letters Patent is hereby corrected as shown below:

Title page, item [75]
Please delete inventor "Masami Yamaoka" from title page and Change order of inventors to:

--Yoshifumi Okabe, Akira Kuroyanagi, Yutaka Tomatsu and Yasuaki Tsuzuki--

Signed and Sealed this

Fifteenth Day of December, 1998

*Attest:*

BRUCE LEHMAN

*Attesting Officer*     Commissioner of Patents and Trademarks